US011280859B2

(12) United States Patent
Dalveren et al.

(10) Patent No.: US 11,280,859 B2
(45) Date of Patent: Mar. 22, 2022

(54) METHOD AND SYSTEMS FOR A RADIO FREQUENCY COIL ASSEMBLY

(71) Applicant: General Electric Company, Schenectady, NY (US)

(72) Inventors: Taylan Dalveren, North Ridgeville, OH (US); Victor Taracila, Beachwood, OH (US); Kolman Juhasz, Rocky River, OH (US); Aleksey Zemskov, Solon, OH (US); Fraser John Laing Robb, Aurora, OH (US); Robert Steven Stormont, Hartland, WI (US)

(73) Assignee: General Electric Company, Schenectady, NY (US)

( * ) Notice: Subject to any disclaimer, the term of this patent is extended or adjusted under 35 U.S.C. 154(b) by 413 days.

(21) Appl. No.: 15/995,025

(22) Filed: May 31, 2018

(65) Prior Publication Data

US 2019/0369176 A1 Dec. 5, 2019

(51) Int. Cl.
*G01R 33/3415* (2006.01)
*G01R 33/34* (2006.01)

(52) U.S. Cl.
CPC ... *G01R 33/3415* (2013.01); *G01R 33/34007* (2013.01); *G01R 33/34023* (2013.01); *G01R 33/34046* (2013.01)

(58) Field of Classification Search
CPC .......... G01R 33/3415; G01R 33/34046; G01R 33/34023; G01R 33/34007; G01R 33/3621; G01R 33/3628; G01R 33/34084; G01R 33/34092; G01R 33/34069; G01R 33/3642; G01R 33/36; G01R 33/385; A61B 5/055
See application file for complete search history.

(56) References Cited

U.S. PATENT DOCUMENTS

| 4,835,472 | A | 5/1989 | Zabel et al. | |
|---|---|---|---|---|
| 6,980,000 | B2 * | 12/2005 | Wong | G01R 33/34053 324/318 |
| 7,663,367 | B2 | 2/2010 | Wiggins | |
| 8,030,930 | B2 * | 10/2011 | Li | G01R 33/34046 324/322 |
| 8,269,498 | B2 | 9/2012 | Zhang | |

(Continued)

FOREIGN PATENT DOCUMENTS

| KR | 20050039615 A | 4/2005 |
|---|---|---|
| WO | 2007030832 A2 | 3/2007 |

OTHER PUBLICATIONS

Corea et al., "Screen-printed flexible MRI receive coils," Nature Communications vol. 7, Article No. 10839 (2016), 7 pages.

*Primary Examiner* — Catherine B Kuhlman
*Assistant Examiner* — Nicholas A Robinson

(57) ABSTRACT

Various methods and systems are provided for radio frequency (RF) coils for magnetic resonance imaging (MRI). In one embodiment, an RF coil assembly for an MRI system includes a posterior end including a first set of flexible RF coils; an anterior end including a second set of flexible RF coils; a central section extending between the posterior end and anterior end, wherein the posterior end and the anterior end are bendable to the central section. Each flexible RF coil of the first set and second set of flexible RF coils includes a loop portion comprising a coupling electronics portion and at least two parallel, distributed capacitance wire conductors encapsulated and separated by a dielectric material.

21 Claims, 13 Drawing Sheets

(56) References Cited

U.S. PATENT DOCUMENTS

| | | |
|---|---|---|
| 8,598,880 B2 | 12/2013 | Dalveren et al. |
| 9,002,431 B2 | 4/2015 | Jones |
| 10,274,555 B2 * | 4/2019 | Findeklee ........... G01R 33/3635 |
| 2004/0022186 A1 | 2/2004 | Kump et al. |
| 2004/0162583 A1 | 8/2004 | Bingham et al. |
| 2004/0217761 A1 | 11/2004 | Wong et al. |
| 2005/0104591 A1 | 5/2005 | Qu |
| 2008/0174314 A1 | 7/2008 | Holwell |
| 2008/0204021 A1 | 8/2008 | Leussler et al. |
| 2012/0153955 A1 | 6/2012 | Wong |
| 2013/0093425 A1 * | 4/2013 | Chu ..................... G01R 33/365 324/318 |
| 2013/0137969 A1 * | 5/2013 | Jones ..................... A61B 5/055 600/421 |
| 2013/0317346 A1 | 11/2013 | Alagappan et al. |
| 2013/0335086 A1 | 12/2013 | Shah et al. |
| 2014/0091791 A1 * | 4/2014 | Bulumulla ......... G01R 33/3642 324/309 |
| 2014/0103931 A1 * | 4/2014 | Soutome ................ A61B 5/055 324/322 |
| 2014/0197832 A1 * | 7/2014 | Driesel .................... H01Q 7/04 324/307 |
| 2014/0200437 A1 | 7/2014 | Yager |
| 2014/0210466 A1 | 7/2014 | Arias et al. |
| 2015/0017378 A1 | 1/2015 | Stone |
| 2015/0168515 A1 | 6/2015 | Takahiro |
| 2016/0356867 A1 * | 12/2016 | Fujita ................. G01R 33/3642 |
| 2016/0356868 A1 * | 12/2016 | Stormont ................ G01R 33/34 |
| 2017/0248391 A1 * | 8/2017 | Andresen ................ A43B 7/32 |
| 2018/0335491 A1 * | 11/2018 | Yang ..................... G01R 33/341 |
| 2019/0154773 A1 | 5/2019 | Stack |
| 2019/0154775 A1 | 5/2019 | Stack |
| 2019/0277926 A1 | 9/2019 | Stormont |
| 2019/0293738 A1 | 9/2019 | Popescu |
| 2019/0310327 A1 | 10/2019 | Stormont |

\* cited by examiner

METHOD AND SYSTEMS FOR A RADIO FREQUENCY COIL ASSEMBLY

FIELD

Embodiments of the subject matter disclosed herein relate to medical diagnostic imaging, and in more particular, to systems for magnetic resonance imaging.

BACKGROUND

Magnetic resonance imaging (MRI) is a medical imaging modality that can produce images of an interior of a patient without x-ray radiation or other types of ionizing radiation. An MRI system is a medical imaging device utilizing a superconducting magnet to create a strong, uniform, static magnetic field within a designated region (e.g., within a passage shaped to receive a patient). When a body of a patient (or portion of the body of the patient) is positioned within the magnetic field, nuclear spins associated with the hydrogen nuclei that form water within tissues of the patient become polarized. The magnetic moments associated with these spins become aligned along the direction of the magnetic field and result in a small net tissue magnetization in the direction of the magnetic field. MRI systems additionally include magnetic gradient coils that produce spatially-varying magnetic fields of smaller magnitudes relative to a magnitude of the uniform magnetic field resulting from the superconducting magnet. The spatially-varying magnetic fields are configured to be orthogonal to each other in order to spatially encode the region by creating a signature resonance frequency of the hydrogen nuclei at different locations in the body of the patient. Radio frequency (RF) coil assemblies are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an RF signal. This signal is detected by the MRI system and is transformed into an image by a computer using known reconstruction algorithms.

In order to detect the RF signals emitted by the body of the patient, an RF coil assembly is often positioned proximate anatomical features to be imaged by the MRI system. An image quality of images produced by the MRI system is influenced by an ability of the RF coil assembly to closely conform to the contours of the body of the patient.

BRIEF DESCRIPTION

In one embodiment, a radio frequency (RF) coil assembly for a magnetic resonance imaging (MRI) system includes a posterior end including a first set of flexible RF coils; an anterior end including a second set of flexible RF coils; a central section extending between the posterior end and anterior end, wherein the posterior end and the anterior end are bendable to the central section. Each flexible RF coil of the first set and second set of flexible RF coils includes a loop portion comprising a coupling electronics portion and at least two parallel, distributed capacitance wire conductors encapsulated and separated by a dielectric material.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 2-6 and 13 are shown to scale, although other relative dimensions may be used, if desired.

DETAILED DESCRIPTION

Figure 3:
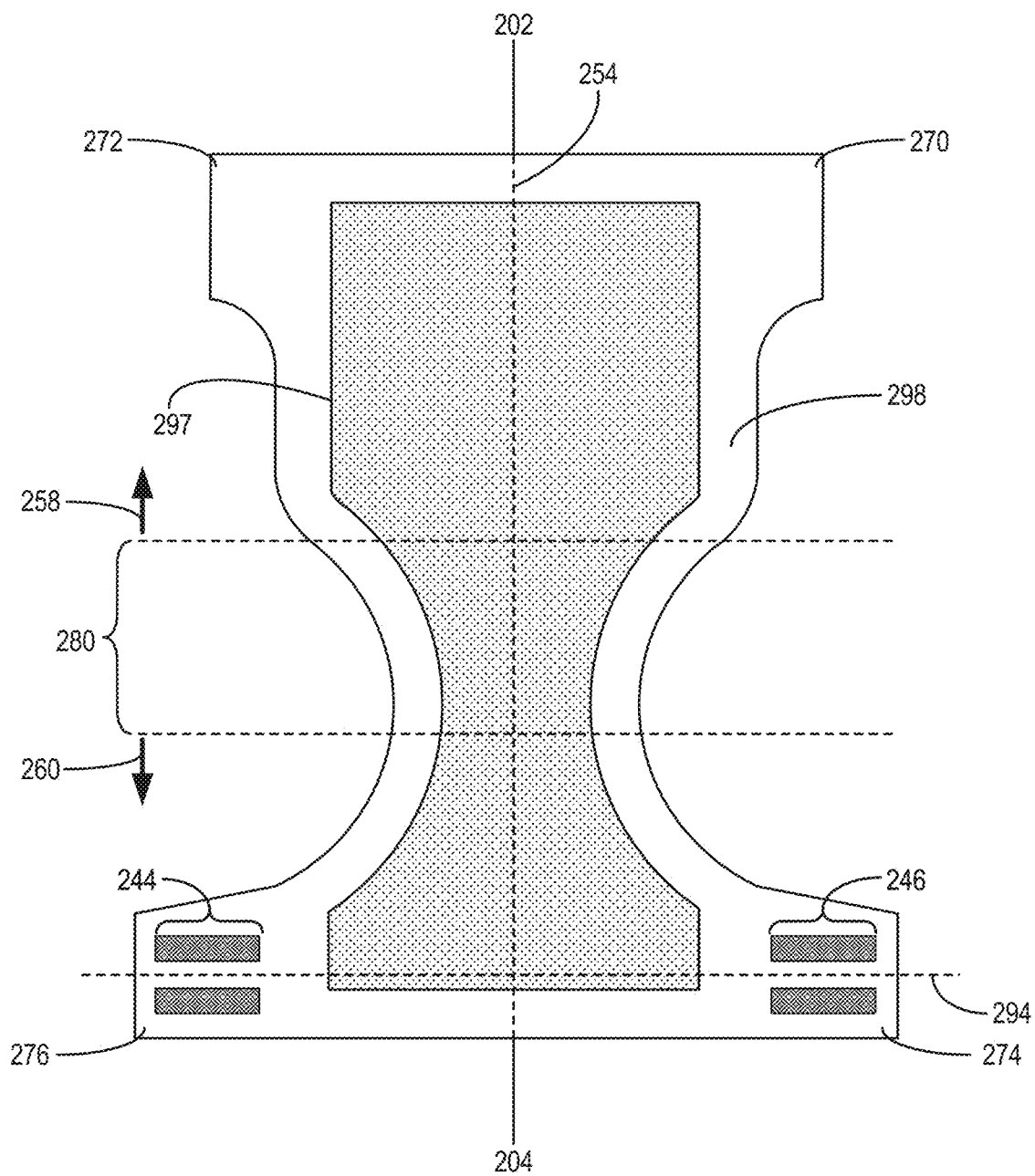
FIG. 3 shows a view of an inner side of the RF coil assembly of FIG. 2.
Figure 4:
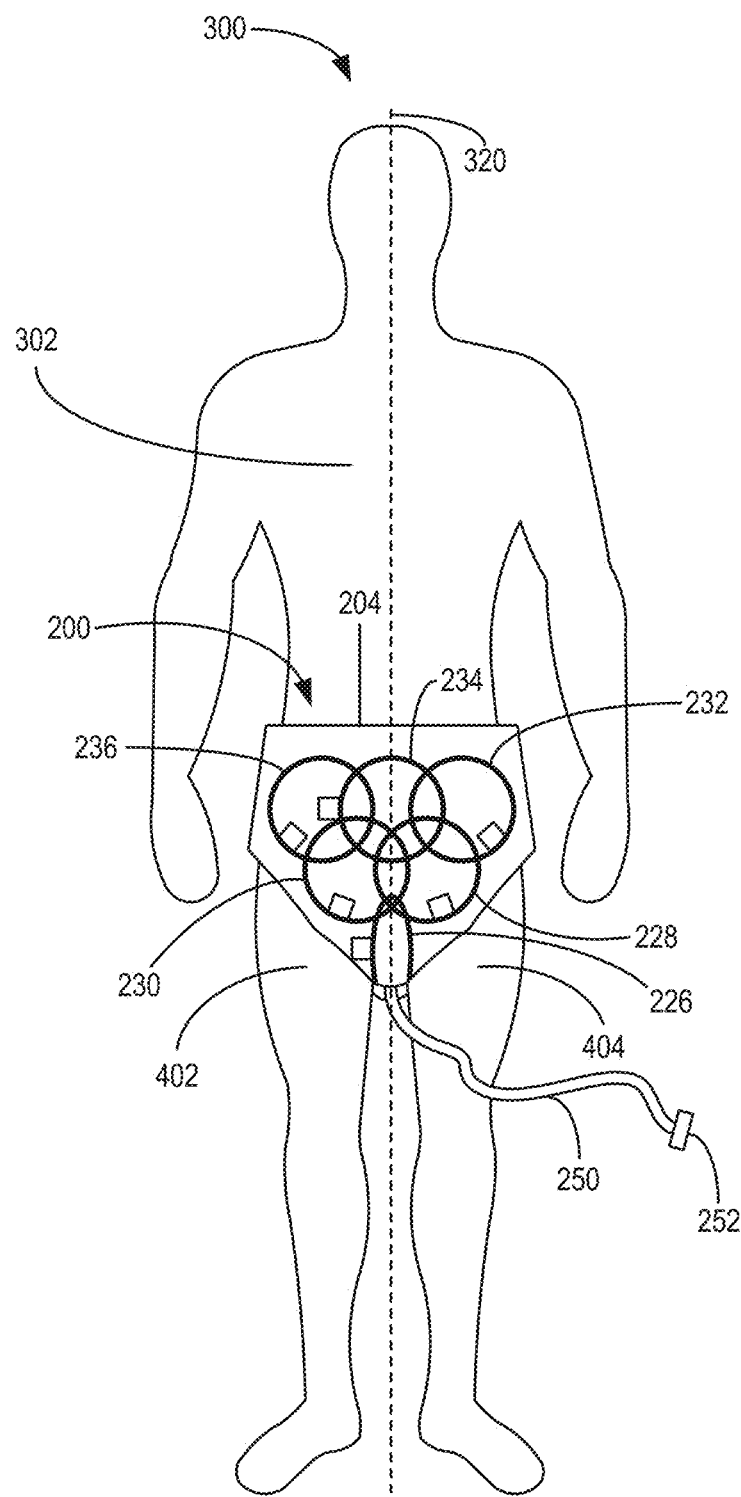
FIG. 4 shows a front view of a patient wearing the RF coil assembly of FIGS. 2-3.
Figure 5:
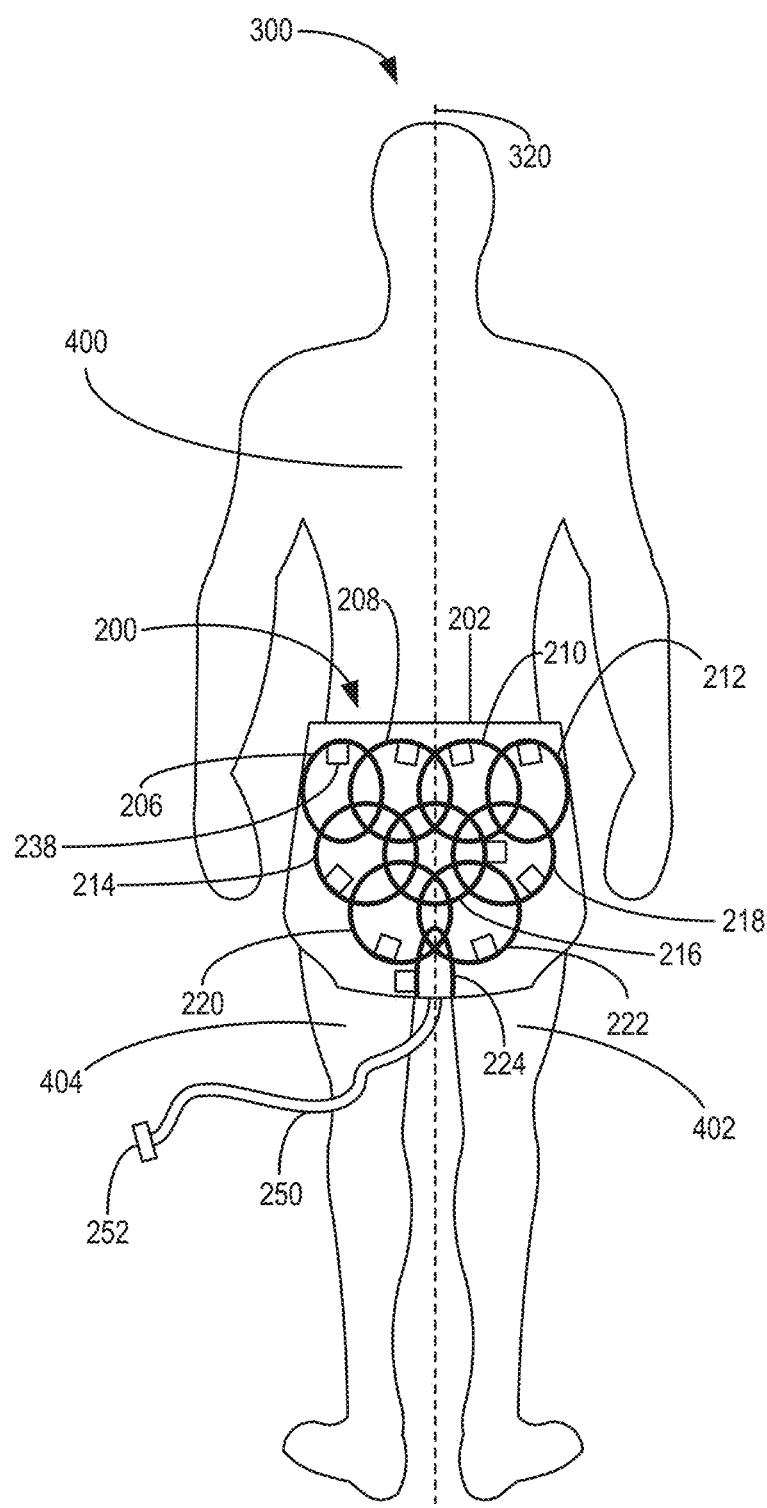
FIG. 5 shows a rear view of the patient of FIG. 3 wearing the RF coil assembly of FIGS. 2-3.
Figure 6:
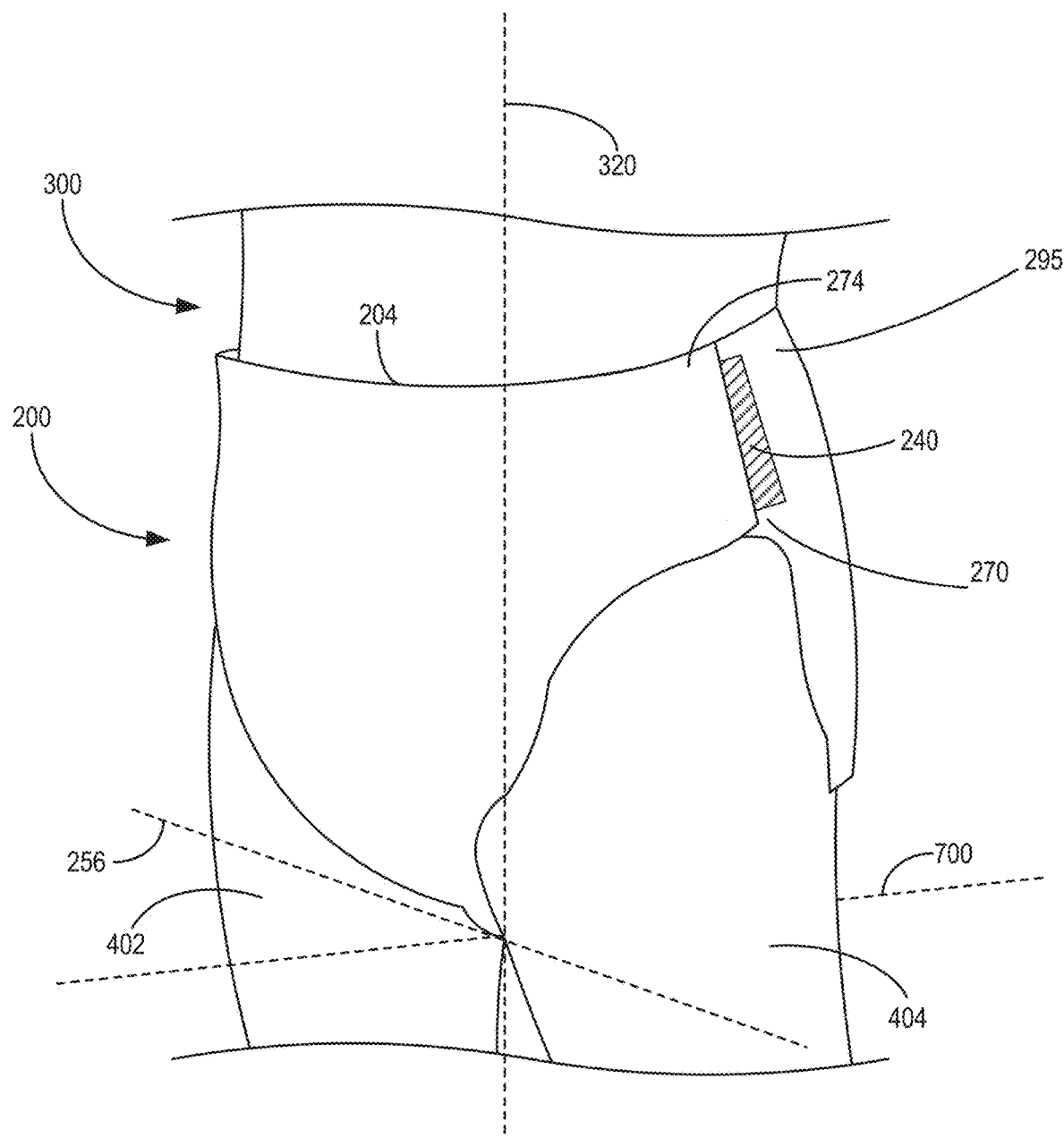
FIG. 6 shows an enlarged perspective view of the patient of FIGS. 4-5 wearing the RF coil assembly of FIGS. 2-3.

The following description relates to various embodiments of systems and methods for a radio frequency (RF) coil assembly for magnetic resonance imaging (MRI). An MRI system, such as the MRI system shown by FIG. 1, includes a flexible RF coil assembly, such as the RF coil assembly shown by FIGS. 2-3. The RF coil assembly includes a posterior end, an anterior end, and a plurality of RF coils extending from the posterior end to the anterior end. The posterior end and anterior end may be positioned at opposing sides of a patient, as shown by FIGS. 4-6, in order to image the patient via the MRI system. RF coils extending between the posterior end and the anterior end may be positioned proximate to a groin of the patient. In some examples, such as the example shown by FIG. 13, the RF coil assembly may include only the RF coils at the posterior end and the RF coils at the anterior end. The RF coils are configured with coupling electronics and distributed capacitance wire conductors, as described with reference to FIGS. 7-12, such that each RF coil is transparent to each other RF coil. In this way, the ends of the RF coil assembly may be positioned against the body of the patient and wrapped around the patient in order to image portions of the body that are difficult to image with rigid RF coil assemblies, such as the prostate. Because the RF coils include the coupling electronics and distributed capacitance wire conductors, the sections of the RF coil assembly may move and/or overlap relative to each other without degradation of MR signals transmitted to the MRI system by the RF coils.

Figure 1:
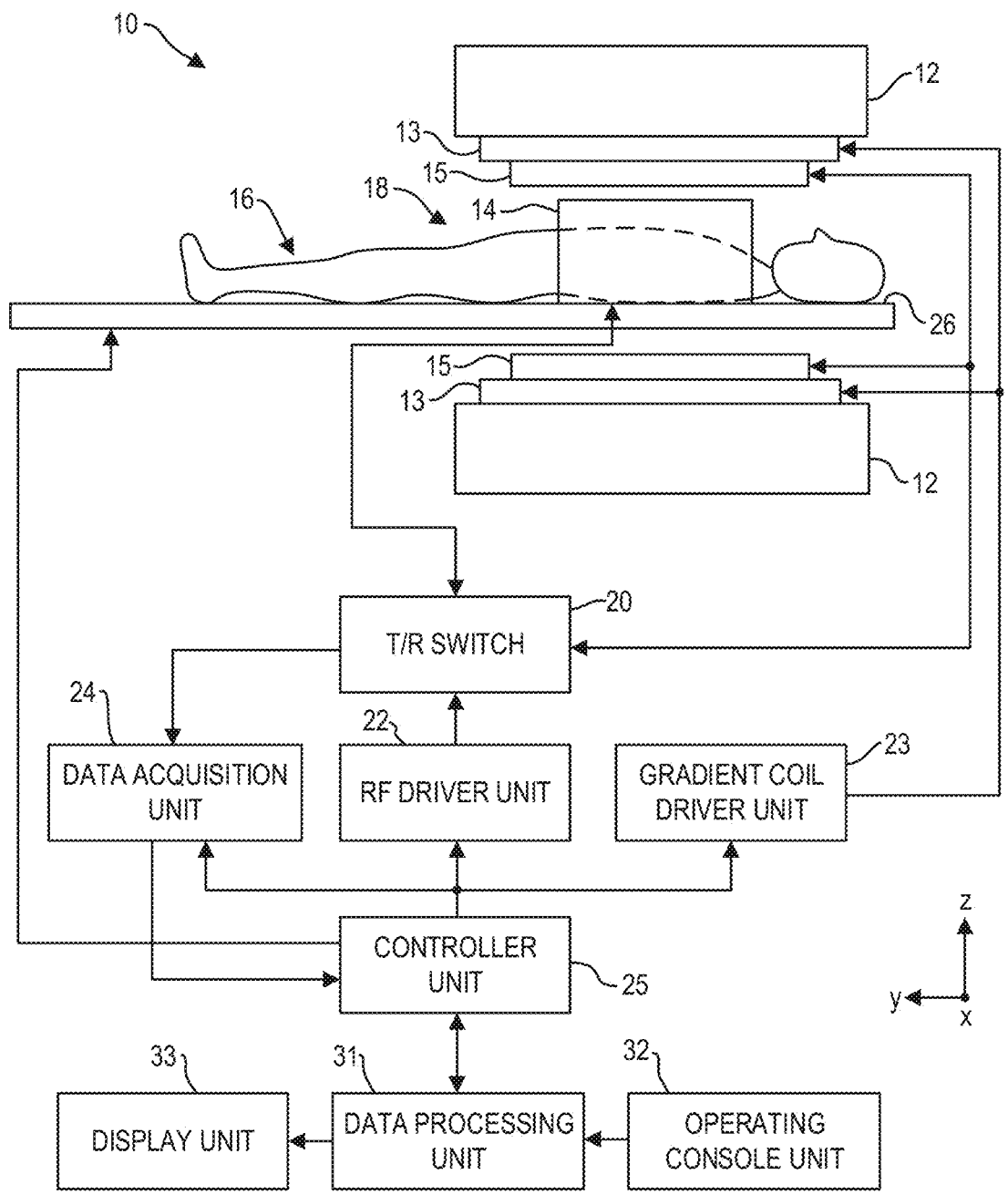
FIG. 1 schematically shows an MRI system including at least one RF coil, according to an embodiment.

Turning now to FIG. 1, a magnetic resonance imaging (MRI) apparatus 10 is shown. The MRI apparatus 10 includes a superconducting field magnet unit 12, a gradient coil unit 13, an RF coil unit 14 (which may be referred to herein as an RF coil assembly), an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In one example, the RF coil unit 14 is a surface coil, which is a local coil that is typically placed proximate to the anatomy of interest of a subject 16 (e.g., a patient). Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are independent but electromagnetically coupled structures. The MRI apparatus 10 transmits electromagnetic pulse signals to the subject 16 placed in an imaging space 18 with a static magnetic field formed to perform a scan for obtaining magnetic resonance signals from the subject 16 to reconstruct an image of a slice of the subject 16 based on the magnetic resonance signals thus obtained by the scan.

The superconducting magnet unit 12 includes, for example, an annular superconducting magnet, which is mounted within a toroidal vacuum vessel. The magnet defines a cylindrical space surrounding the subject 16, and generates a constant, strong, uniform, static magnetic along the Z direction of the cylindrical space.

The MRI apparatus 10 also includes the gradient coil unit 13 that generates a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field, which inclines into one of three spatial axes perpendicular to each other, and generates a gradient magnetic field in each of frequency encoding direction, phase encoding direction, and slice selection direction in accordance with the imaging condition. More specifically, the gradient coil unit 13 applies a gradient magnetic field in the slice selection direction of the subject 16, to select the slice; and the RF body coil unit 15 transmits an RF signal to a selected slice of the subject 16 and excites it. The gradient coil unit 13 also applies a gradient field in the phase encoding direction of the subject 16 to phase encode the magnetic resonance signals from the slice excited by the RF signal. The gradient coil unit 13 then applies a gradient magnetic field in the frequency encoding direction of the subject 16 to frequency encode the magnetic resonance signals from the slice excited by the RF signal.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field is formed by the superconducting magnet unit 12, the RF coil unit 14 transmits, based on a control signal from the controller unit 25, an RF signal that is an electromagnetic wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. The RF coil unit 14 may transmit and receive an RF signal using the same RF coil.

The RF body coil unit 15 is disposed, for example, to enclose the imaging space 18, and produces RF magnetic field pulses orthogonal to the main magnetic field produced by the superconducting field magnet unit 12 within the imaging space 18 to excite the nuclei. In contrast to the RF coil unit 14, which may be disconnected from the MR apparatus 10 and replaced with another RF coil unit, the RF body coil unit 15 is fixedly attached and connected to the MRI apparatus 10. Furthermore, whereas local coils such as those comprising the RF coil unit 14 can transmit to or receive signals from a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity, with relatively high RF power deposited in the subject in return. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard, and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image or three-dimensional (3D) image of the subject 16 generated by the data processing unit 31.

During a scan, RF coil-interfacing cables may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil 14 receives the MR signals. More generally, RF coils are used to transmit RF excitation signals ("transmit coil"), and to receive the MR signals emitted by an imaging subject ("receive coil"). In an example, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may be independent structures that are physically coupled to each other via a data acquisition unit or other processing unit. For enhanced image quality, however, it may be desirable to provide a receive coil that is mechanically and electrically isolated from the transmit coil. In such case it is desirable that the receive coil, in its receive mode, be electromagnetically coupled to and resonant with an RF "echo" that is stimulated by the transmit coil. However, during transmit mode, it may be desirable that the receive coil is electromagnetically decoupled from and therefore not resonant with the transmit coil, during actual transmission of the RF signal. Such decoupling decreases a likelihood of noise being produced within the auxiliary circuitry when the receive coil couples to the full power of the RF signal. Additional details regarding the uncoupling of the receive RF coil will be described below.

Conventional RF coils may include acid etched copper traces (loops) on printed circuit boards (PCBs) with lumped electronic components (e.g., capacitors, inductors, baluns, resistors, etc.), matching circuitry, decoupling circuitry, and pre-amplifiers. Such a configuration is typically very bulky, heavy, and rigid, and requires relatively strict placement of the coils relative to each other in an array (e.g., a set) to prevent coupling interactions among coil elements that may degrade image quality. As such, conventional RF coils and RF coil arrays lack flexibility and hence may not conform to patient anatomy, degrading imaging quality and patient comfort.

Thus, according to embodiments disclosed herein, an RF coil assembly, such as RF coil unit 14, may include distributed capacitance wire conductors rather than copper traces on PCBs with lumped electronic components. As a result, the RF coil assembly may be lightweight and flexible, allowing placement in low cost, lightweight, waterproof, and/or flame retardant fabrics or materials. The coupling electronics portion coupling the loop portion of the RF coil (e.g., the distributed capacitance wire) may be miniaturized and utilize a low input impedance pre-amplifier, which is optimized for high source impedance (e.g., due to impedance matching circuitry) and allows flexible overlaps among coil elements in an RF coil array (e.g., RF coil set). Further, the RF coil-interfacing cable between the RF coils and system processing components may be flexible and include integrated transparency functionality in the form of distributed baluns, which allows rigid electronic components to be avoided and aids in spreading of the heat load.

The RF coil assemblies described herein may be structured for imaging specific anatomical features of a patient that are often difficult to image with rigid (e.g., inflexible) RF coil arrays. Specifically, the RF coil assemblies of the present disclosure (e.g., illustrated in FIGS. 2-6 and 13) includes a posterior end, an anterior end, and a central section joining the posterior end to the anterior end. The posterior end, anterior end, and central section are each formed of a flexible material and may each include at least one RF coil (e.g., similar to the examples described below with reference to FIGS. 2-6). The RF coils of the posterior end, anterior end, and central section are electrically coupled to a common output (e.g., a single coil-interfacing cable or cable harness) that is electrically coupleable to the MRI apparatus 10. Each of the posterior end, anterior end, and central section may be wrapped around the anatomical feature of interest to be imaged by the MRI apparatus 10. Specifically, the RF coil assembly may be coupled to the patient proximate to the groin of the patient, with the anterior end positioned at a front side of the patient, the posterior end positioned at a rear side of the patient, and the central section positioned at the perineum of the patient. In this position, the RF coil assembly may be utilized to image the prostate and/or surrounding anatomy of the patient.

Imaging the prostate and/or surrounding anatomy is often difficult and/or uncomfortable for the patient with conventional, rigid RF coil arrays due to the varying size and/or curvature of the anatomy from patient to patient. Conventional, rigid RF coil arrays may be unable to closely conform to the anatomy of the patient. However, the flexible RF coil assembly disclosed herein may be fitted to a wide variety of patients of different sizes (e.g., weights, heights, etc.). Further, the RF coil assembly disclosed herein may increase a signal-to-noise ratio (SNR) of the images produced by the MRI apparatus 10 relative to conventional RF coils due to the ability of the sections of the RF coil assembly to wrap around the anatomy of the patient, enabling the RF coils to be positioned closer to the body of the patient. The ability of the RF coil assembly to fit to a wider variety of patients may decrease an imaging cost of the MRI apparatus 10 (e.g., by reducing a number of different RF coil assemblies utilized to image patients via the MRI apparatus 10) and may increase the imaging quality of the MRI apparatus 10 (e.g., by increasing the SNR). Further, by configuring the central section to be positioned at the perineum of the patient and to include at least one RF coil, the imaging quality of the MRI apparatus 10 during conditions in which the RF coil assembly is utilized to image the prostate of the patient may be increased.

Figure 2:
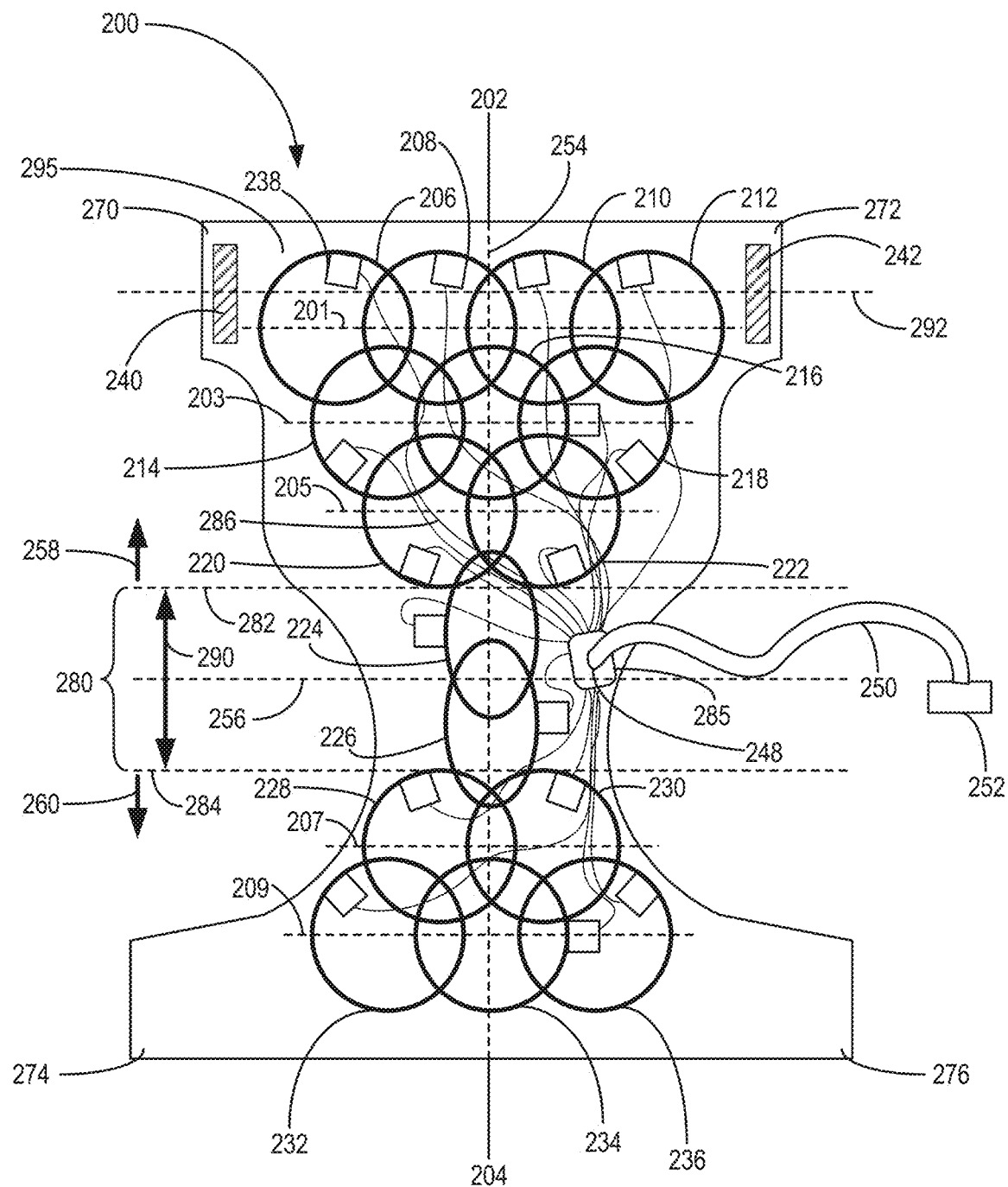
FIG. 2 shows a view of an outer side of an RF coil assembly for an MRI system.

Turning now to FIG. 2, a first view of RF coil assembly 200 is shown. RF coil assembly 200 (which may be referred to herein as a wearable RF coil assembly) may be similar to the RF coil unit 14 described above with reference to FIG. 1. For example, RF coil assembly 200 may be electrically coupleable to an MRI apparatus (e.g., MRI apparatus 10 of FIG. 1 and described above) for imaging one or more anatomical features of a patient. In one example, RF coil assembly 200 may be utilized in order to image the prostate of the patient (e.g., similar to the example described above with reference to RF coil unit 14). In another example, RF coil assembly 200 may be utilized to image other anatomical features proximate to the groin of the patient (e.g., genitals).

The RF coil assembly 200 is a flexible RF coil assembly that may deform (e.g., bend, twist, etc.) in multiple different directions. The RF coil assembly 200 includes posterior end 258 and anterior end 260, with the posterior end 258 configured to couple to (e.g., wrap around) a posterior side (e.g., rear side) of the patient, and with the anterior end 260 configured to couple to (e.g. wrap around) an anterior side (e.g., front side) of the patient. Central section 280 of the RF coil assembly 200, described further below, is configured to extend between the posterior side and anterior side of the patient along the perineum of the patient during conditions in which the RF coil assembly 200 is coupled to the patient and includes at least one RF coil for imaging the region of the perineum. The posterior end 258, anterior end 260, and central section 280 are each moveable (e.g., pivotable and/or bendable) relative to each other. For example, posterior end 258 and anterior end 260 may bend relative to the central section 280 to a position in which the posterior end 258 and anterior end 260 are approximately perpendicular to the central section 280. By configuring the RF coil assembly 200 to be flexible in this way, the posterior end 258 and anterior end 260 are bendable to the central section 280. However, in the view shown by FIG. 2, the RF coil assembly 200 is in a flattened configuration in which the RF coil assembly 200 is not coupled to the patient. In the flattened configuration, each of the posterior end 258, anterior end 260, and central section 280 are relatively flat (e.g., not moved, bent, etc. relative to each other) and planar (e.g., positioned parallel with each other along a same plane). The posterior end 258, anterior end 260, and central section 280 may be referred to herein collectively as a body of the RF coil assembly 200, and may be worn by the patient for imaging of the patient via the MRI system.

The flattened configuration of the RF coil assembly 200 shown by FIG. 2 shows an outer side of the RF coil assembly 200 comprising a plurality of outer surfaces, such as outer surface 295. The outer side of the RF coil assembly 200 is a side that is not in direct contact with the body of the patient during conditions in which the RF coil assembly 200 is coupled to (e.g., worn by) the patient. Further, the outer surfaces, such as outer surface 295, are not in direct contact with the body of the patient during conditions in which the RF coil assembly 200 is coupled to the patient. The RF coil assembly 200 further includes an inner side (shown by FIG. 3 and removed from FIG. 2 for clarity) configured to be in direct contact (e.g., face-sharing contact, with no other components positioned between) with the body of the patient during conditions in which the RF coil assembly 200 is coupled to the patient (e.g., for imaging via the MRI system). In some examples, the inner side may include one or more inner surfaces (e.g., inner surface 298 shown by FIG. 3) comprising pads, cushions, etc. (e.g., pad 297) positioned to increase patient comfort during conditions in which the RF coil assembly 200 is coupled to the patient. In this way, the RF coils (described in more detail below) of the RF coil assembly 200 may be sandwiched between at least two layers of material (e.g., the outer surface and inner surface).

In the examples shown, the posterior end 258 includes nine RF coils (e.g., first RF coil 206, second RF coil 208, third RF coil 210, fourth RF coil 212, fifth RF coil 214, sixth RF coil 216, seventh RF coil 218, eighth RF coil 220, and ninth RF coil 222), the central section 280 includes two RF coils (e.g., tenth RF coil 224 and eleventh RF coil 226), and the anterior end 260 includes five RF coils (e.g., twelfth RF coil 228, thirteenth RF coil 230, fourteenth RF coil 232, fifteenth RF coil 234, and sixteenth RF coil 236). In total, the RF coil assembly 200 includes sixteen RF coils. The RF coils described herein may be referred to as RF coil elements. The nine RF coils of the posterior end 258 are arranged into three separate rows and may be referred to herein collectively as an RF coil array (e.g., an RF coil set), with a first row positioned furthest from the central section 280 including four coils centered along axis 201, a second row adjacent to the first row including three coils centered along axis 203, and a third row positioned closest to the central section 280 including two coils centered along axis 205. Specifically, first RF coil 206, second RF coil 208, third RF coil 210, and fourth RF coil 212 of the posterior end 258 are each positioned along axis 201 and are bisected by the axis 201, fifth RF coil 214, sixth RF coil 216, and seventh RF coil 218 are each positioned along axis 203 and are bisected by the axis 203, and eighth RF coil 220 and ninth RF coil 222 are each positioned along axis 205 and are bisected by the axis 205. Edges of each of the eighth RF coil 220 and ninth RF coil 222 are positioned along axis 282, and edges of the twelfth RF coil 228 and thirteenth RF coil 230 are positioned along axis 284. The posterior end 258 is bounded by the axis 282 and posterior edge 202, and the anterior end 260 is bounded by the axis 284 and the anterior edge 204. Posterior edge 202 may be referred to herein as a terminating edge of the posterior end 258 (e.g., an edge defining a boundary of the posterior end 258), and anterior edge 204 may be referred to herein as a terminating edge of the anterior end 260 (e.g., an edge defining a boundary of the anterior end 260).

The RF coils of the second row of the posterior end 258 may overlap the RF coils of the first row of the posterior end 258 (e.g., the row of RF coils positioned closest to the posterior edge 202) and the third row of the posterior end 258 (e.g., the row of RF coils of the posterior end 258 positioned furthest from the posterior edge 202). The RF coils of the second row are positioned between the RF coils of the first row and the RF coils of the third row of the posterior end 258. Specifically, as shown by FIG. 2, fifth RF coil 214 of the second row of the posterior end 258 overlaps the first RF coil 206 of the first row and the eighth RF coil 220 of the third row of the posterior end 258, sixth RF coil 216 overlaps the second RF coil 208 and third RF coil 210 of the first row of the posterior end 258 in addition to the eighth RF coil 220 and ninth RF coil 222 of the third row of the posterior end 258, and seventh RF coil 218 overlaps the third RF coil 210 and fourth RF coil 212 of the first row of the posterior end 258 in addition to the ninth RF coil 222 of the third row of the posterior end 258. As described herein, overlapping RF coils refers to a loop portion of an RF coil encircling and/or directly contacting at least some of a loop portion of another RF coil. For example, as shown by FIG. 2, first RF coil 206 overlaps with second RF coil 208 and fifth RF coil 214. However, first RF coil 206 does not overlap with third RF coil 210, fourth RF coil 212, sixth RF coil 216, seventh RF coil 218, eighth RF coil 220, ninth RF coil 222, or any of the RF coils of the central section 280 and anterior end 260. Further, none of the RF coils of the posterior end 258 overlap with any of the RF coils of the anterior end 260 (e.g., the posterior end 258 is spaced apart from the anterior end 260 by the central section 280 such that the RF coils of the posterior end 258 do not overlap the RF coils of the anterior end 260).

The five RF coils of the anterior end 260 are arranged into two separate rows and may be referred to herein collectively as an RF coil array (e.g., an RF coil set), with a first row positioned further from the central section 280 including three coils centered along axis 209 and a second row positioned closer to the central section 280 including two coils centered along axis 207. Specifically, the twelfth RF coil 228 and thirteenth RF coil 230 of anterior end 260 are positioned along axis 207 and are bisected by the axis 207, and the fourteenth RF coil 232, fifteenth RF coil 234, and sixteenth RF coil 236 of anterior end 260 are positioned along axis 209 and are bisected by the axis 209. The RF coils of the first row of the anterior end 260 may overlap with the RF coils of the second row of the anterior end 260. Specifically, as shown by FIG. 2, twelfth RF coil 228 overlaps thirteenth RF coil 230, fourteenth RF coil 232, and fifteenth RF coil 234, and thirteenth RF coil 230 overlaps twelfth RF coil 228, fifteenth RF coil 234, and sixteenth RF coil 236. The RF coils of the first row of the anterior end 260 are positioned closer to the anterior edge 204 than the RF coils of the second row of the anterior end 260.

The central section 280 is bounded by the axis 282 and axis 284, with a portion of tenth RF coil 224 extending into the posterior end 258 to overlap at least one corresponding RF coil of the RF coils of the posterior end 258, and with a portion of the eleventh RF coil 226 extending into the anterior end 260 to overlap at least one corresponding RF coil of the RF coils of the anterior end 260. Specifically, tenth RF coil 224 overlaps the eighth RF coil 220 and ninth RF coil 222, and eleventh RF coil 226 overlaps the twelfth RF coil 228 and thirteenth RF coil 230. Further, tenth RF coil 224 and eleventh RF coil 226 overlap with each other. The tenth RF coil 224 and eleventh RF coil 226 may be referred to herein collectively as an RF coil array (e.g., an RF coil set). Each of the tenth RF coil 224 and eleventh RF coil 226 are centered along central axis 254 of the RF coil assembly 200, with the central axis 254 extending between posterior edge 202 at the posterior end 258 and anterior edge 204 at the anterior end 260. The central axis 254 bisects each of the posterior edge 202 and the anterior edge 204 during conditions in which the RF coil assembly 200 is in the flattened configuration (e.g., as shown by FIG. 2).

In the example shown by FIG. 2, the RF coils of the RF coil assembly 200 at the posterior end 258 have a same diameter and same eccentricity as the RF coils of the RF coil assembly 200 at the anterior end 260. However, the RF coils at the central section 280 have a different eccentricity relative to the RF coils at the posterior end 258 and anterior end 260. In one example, the eccentricity of the RF coils of the posterior end 258 and anterior end 260 is 0 (e.g., the RF coils at the posterior end 258 and anterior end 260 have a circular shape), and the eccentricity of the RF coils of the central section 280 (e.g., tenth RF coil 224 and eleventh RF coil 226) is 0.75 (e.g., the RF coils at the central section 280 have an oval shape). In other examples, the eccentricity of the RF coils of the central section 280 may be a different value (e.g., 0.5, 0.6, etc.), and/or the eccentricity of the RF coils of the central section 280 may be the same as the eccentricity of one or more RF coils of the posterior end 258 and/or anterior end 260.

In some examples, one or more of the RF coils of the RF coil assembly 200 may have a different diameter than other RF coils of the RF coil assembly 200. For example, the RF coils of the central section 280 may have a different diameter (e.g., a smaller diameter) than RF coils of the posterior end 258 and/or anterior end 260. As one example, a diameter of one or both of the RF coils of the central section 280 may be 9 centimeters, and a diameter of RF coils of the posterior end 258 and anterior end 260 may be 11 centimeters. Additionally or alternately, the tenth RF coil 224 may have a different diameter and/or eccentricity relative to the eleventh RF coil 226. In another example, RF coils of the posterior end 258 may have a different diameter than RF coils of the anterior end 260. In yet another example, one or more of the RF coils of the posterior end 258 may have a different diameter relative to other RF coils of the posterior end 258, and one or more RF coils of the anterior end 260 may have a different diameter relative to other RF coils of the anterior end 260.

As one particular example, the RF coils of the first row of the posterior end 258 (e.g., first RF coil 206, second RF coil 208, third RF coil 210, and fourth RF coil 212) may have a larger, first diameter (e.g., 11 centimeters), the RF coils of the second row of the posterior end 258 (e.g., fifth RF coil 214, sixth RF coil 216, and seventh RF coil 218) may have a smaller, second diameter (e.g., 10 centimeters), and the RF coils of the third row of the posterior end 258 (e.g., eighth RF coil 220 and ninth RF coil 222) may have a yet smaller, third diameter (e.g., 9 centimeters). As another particular example, the RF coils of the first row of the anterior end 260 (e.g., fourteenth RF coil 232, fifteenth RF coil 234, and sixteenth RF coil 236) may have a larger diameter (e.g., 11 centimeters), and the RF coils of the second row of the anterior end 260 (e.g., twelfth RF coil 228 and thirteenth RF coil 230) may have a smaller diameter (e.g., 10 centimeters). Other examples are possible.

By configuring the RF coils of the posterior end 258 and/or anterior end 260 to have different diameters as described above, a cost of the RF coil assembly 200 may be decreased and/or an imaging quality of the RF coil assembly 200 (e.g., a quality of images produced by the MRI system via signals received from the RF coil assembly 200) may be increased. For example, RF coil assembly 200 may be configured to image the prostate of the patient as described above. As the distance between the prostate and an example RF coil of the RF coil assembly 200 increases, an imaging quality of the example RF coil may decrease. As a result, due to the position of the prostate deep within the body of the patient, RF coils with a same diameter that are positioned at different distances relative to the prostate may have different respective imaging qualities when imaging the prostate. As one example, RF coils of the central section 280 are configured to be positioned closer to the prostate (e.g., at the perineum) than the RF coils of the posterior end 258 and anterior end 260. The RF coils of the central section 280 may have a smaller diameter than the RF coils of the posterior end 258 and/or anterior end 260 while having a same imaging quality as the RF coils of the posterior end 258 and/or anterior end 260 due to the closer proximity of the RF coils of the central section 280 to the prostate. In this way, the RF coils of the central section 280 may have a reduced size relative to the RF coils of the posterior end 258 and/or anterior end 260, and a cost of the RF coil assembly 200 may be decreased without degradation of the imaging quality of the RF coil assembly 200.

Further, due to the different distances between the prostate and each RF coil of the posterior end 258, the size (e.g., diameter) of some of the RF coils of the posterior end 258 may be reduced relative to other RF coils of the posterior end 258 while providing a same imaging quality (e.g., without degradation of the imaging quality of the RF coil assembly 200). For example, the RF coils of the first row of the posterior end 258 (e.g., first RF coil 206, second RF coil 208, third RF coil 210, and fourth RF coil 212) may be positioned a greater distance from the prostate than the RF coils of the third row of the posterior end 258 (e.g., eighth RF coil 220 and ninth RF coil 222) during conditions in which the RF coil assembly 200 is coupled to the patient (e.g., worn by the patient to image the prostate). As a result, the RF coils of the third row of the posterior end 258 may be reduced in size (e.g., diameter) relative to the RF coils of the first row of the posterior end 258 while providing a same imaging quality as the RF coils of the first row of the posterior end 258 (e.g., without degradation of the imaging quality of the RF coil assembly 200), and the cost of the RF coil assembly 200 may be decreased (e.g., by reducing the size of the RF coils). Similarly, the RF coils of the first row of the anterior end 260 (e.g., fourteenth RF coil 232, fifteenth RF coil 234, and sixteenth RF coil 236) may be positioned a greater distance from the prostate than the RF coils of the second row of the anterior end 260 (e.g., twelfth RF coil 228 and thirteenth RF coil 230) during conditions in which the RF coil assembly 200 is coupled to the patient. As a result, the RF coils of the second row of the anterior end 260 may be reduced in size (e.g., diameter) relative to the RF coils of the first row of the anterior end 260 while providing a same imaging quality as the RF coils of the first row of the anterior end 260, and the cost of the RF coil assembly 200 may be decreased.

Additionally, by configuring the RF coils of the central section 280 (e.g., tenth RF coil 224 and eleventh RF coil 226) to have a different eccentricity relative to other RF coils of the RF coil assembly 200, a reduced number of RF coils may be included by the central section 280 in order to provide imaging at the perineum of the patient, and a cost of the RF coil assembly 200 may be reduced relative to RF coil assemblies that do not include RF coils having different eccentricities. In particular, because the RF coils of the central section 280 are shaped as ovals rather than circles (e.g., with an eccentricity greater than 0 and less than 1), a length 290 of the central section 280 in the direction of central axis 254 may be imaged by a fewer number of RF coils compared to examples in which the central section 280 does not include non-circular RF coils (e.g., RF coils with the oval shape). Specifically, the size (e.g., length) of the tenth RF coil 224 and eleventh RF coil 226 in the direction of the central axis 254 (e.g., parallel to the central axis 254) is greater than the size (e.g., width) of the tenth RF coil 224 and eleventh RF coil 226 in directions not parallel with the central axis 254 (e.g., perpendicular to the central axis 254). In this configuration, the tenth RF coil 224 and eleventh RF coil 226 may cover more of the length 290 of the central section 280 than circular RF coils while maintaining a relatively narrow profile in the direction perpendicular to the central axis 254, which may improve patient comfort.

For example, in the configuration shown by FIG. 2, the length 290 of the central section 280 is covered by (e.g., in contact with) two non-circular RF coils (e.g., tenth RF coil 224 and eleventh RF coil 226), whereas in other configurations that do not include non-circular RF coils, the same length 290 may be covered by three or more circular RF coils. By including the non-circular RF coils, a cost of the RF coil assembly 200 may be reduced by covering the length 290 of the central section 280 with fewer RF coils. It should be noted that although the tenth RF coil 224 and eleventh RF coil 226 are shown as non-circular RF coils (e.g., with an eccentricity greater than 0) and are described as such herein, in some examples the tenth RF coil 224 and eleventh RF coil 226 may be formed as circular RF coils and may be compressed into the oval shape shown by FIG. 2. Specifically, because the RF coils of the RF coil assembly 200 are flexible RF coils, the tenth RF coil 224 and eleventh RF coil 226 may be circular RF coils that are deformed (e.g., bent) into the non-circular shape shown by FIG. 2. However, in other examples, the tenth RF coil 224 and eleventh RF coil 226 may be formed as non-circular RF coils.

In some examples, the RF coil assembly 200 may include a different number of RF coils relative to the examples described above. For example, the posterior end 258 may include a different number of RF coils than nine RF coils (e.g., seven RF coils, eight RF coils, ten RF coils, etc.), the anterior end 260 may include a different number of RF coils than five RF coils (e.g., three RF coils, four RF coils, six RF coils, etc.), and/or the central section 280 may include a different number of RF coils than two RF coils (e.g., one RF coil, three RF coils, etc.). Further, the total number of RF coils included by the RF coil assembly 200 may be different in some examples. As one example, the RF coil assembly 200 may include a total of fifteen RF coils. As another example, the RF coil assembly 200 may include a total of twelve RF coils. Other examples are possible.

In some examples, the RF coil assembly 200 may include RF coils in a different arrangement relative to the example shown by FIG. 2. As one example, the RF coils of the posterior end 258, anterior end 260, and/or central section 280 may not be arranged in rows. For example, the first RF coil 206, second RF coil 208, third RF coil 210, and fourth RF coil 212 may not be arranged along axis 201. Instead, one or more of the first RF coil 206, second RF coil 208, third RF coil 210, and fourth RF coil 212 may be offset from the axis 201 by a different amount relative to at least one other RF coil of the first RF coil 206, second RF coil 208, third RF coil 210, and fourth RF coil 212. For example, first RF coil 206 and fourth RF coil 212 may be centered along axis 201, and second RF coil 208 and third RF coil 210 may be offset from the axis 201 in the direction of central axis 254 (e.g., shifted toward or away from central section 280). Similarly, the fifth RF coil 214, sixth RF coil 216, and seventh RF coil 218 may not be aligned (e.g., centered) along axis 203, the eighth RF coil 220 and ninth RF coil 222 may not be aligned along axis 205, the tenth RF coil 224 and eleventh RF coil 226 may not be aligned along central axis 254, the twelfth RF coil 228 and thirteenth RF coil 230 may not be aligned along axis 207, and the fourteenth RF coil 232, fifteenth RF coil 234, and sixteenth RF coil 236 may not be aligned along axis 209.

By configuring the posterior end 258 to include a greater number of RF coils than the anterior end 260, an imaging quality of the RF coil assembly 200 may be increased during conditions in which the RF coil assembly 200 is coupled to the patient to image the prostate of the patient. For example, due to the position of the prostate within the body of the patient, additional RF coils at the anterior end 260 (e.g., in addition to the twelfth RF coil 228, thirteenth RF coil 230, fourteenth RF coil 232, fifteenth RF coil 234, and sixteenth RF coil 236) may not increase an imaging quality (e.g., SNR) of the RF coil assembly 200 during conditions in which RF coil assembly 200 is coupled to the patient in order to image the prostate of the patient. However, increasing the number of RF coils at the posterior end 258 relative to the number of RF coils at the anterior end 260 may increase the imaging quality (e.g., SNR) of the RF coil assembly 200 relative to RF coil assemblies that include a same number of RF coils positioned at each side of the patient (e.g., posterior side and anterior side). The increased imaging quality may enable the operator of the MRI system and RF coil assembly 200 to more easily identify the prostate relative to surrounding anatomy in images produced by the MRI system, for example.

In order to couple to the patient, the RF coil assembly 200 includes several extensions configured to wrap around the body of the patient and maintain a position of the RF coil assembly 200 relative to the body of the patient. For example, RF coil assembly 200 includes first extension 270 and second extension 272 positioned at the posterior end 258 of the RF coil assembly 200, and third extension 274 and fourth extension 276 positioned at the anterior end 260 of the RF coil assembly 200. Each of the extensions extends in a direction away from the central axis 254 and perpendicular to the central axis 254. First extension 270 is positioned opposite to the second extension 272 relative to the central axis 254 (e.g., across the central axis and away from the second extension 272), and third extension 274 is positioned opposite to the fourth extension 276 relative to the central axis 254 (e.g., across the central axis 254 and away from the fourth extension 276). In the flattened configuration shown by FIG. 2, the first extension 270 and second extension 272 may each be intersected by an axis 292 perpendicular to the central axis 254 and positioned at the posterior end 258. Similarly, FIG. 3 shows the inner side of the RF coil assembly 200 with the RF coil assembly 200 in the flattened configuration. As shown by FIG. 3, the third extension 274 and fourth extension 276 may each be intersected by an axis 294 perpendicular to the central axis 254 and positioned at the anterior end 260 (with axis 294 parallel to axis 292).

Each of the extensions (e.g., first extension 270, second extension 272, third extension 274, and fourth extension 276) may include one or more fasteners adapted to removably couple the extensions to each other and to maintain the position of the RF coil assembly 200 relative to the body of the patient. For example, removably coupling the extensions to each other may include buckling, buttoning, or otherwise fastening the extensions to each other in a non-permanent way such that the extensions are maintained in engagement with each other but may be disengaged (e.g., decoupled, removed, etc.) from each other (e.g., by the operator of the MRI system) by unbuckling, unbuttoning, unfastening, etc. the extensions from each other. The posterior end 258 and anterior end 260 are removably coupleable with each other via the extensions. For example, first extension 270 includes fasteners 240 configured to couple with counterpart fasteners 244 of third extension 274 (shown by FIG. 3), and second extension 272 includes fasteners 242 configured to couple with counterpart fasteners 246 of fourth extension 276 (shown by FIG. 3). In this configuration, the first extension 270 is removably coupleable with the third extension 274, and the second extension 272 is removably coupleable with the fourth extension 276 (e.g., the first extension 270 and third extension 274 may be coupled and/or decoupled relative to each other via the fasteners 240 and counterpart fasteners 244, and the second extension 272 and fourth extension 276 may be coupled and/or decoupled relative to each other via the fasteners 242 and the counterpart fasteners 246). In one example, the fasteners and counterpart fasteners described above may be hook-and-loop fasteners (e.g., with fastener 240 comprising a plurality of hooks, and with fasteners 244 comprising a plurality of loops adapted to couple with the plurality of hooks). In other examples, the fasteners and counterpart fasteners may be different than the example described above (e.g., fasteners 240 and 242 may comprise buttons configured to engage with counterpart slots of counterpart fasteners 244 and 246, respectively).

In some examples, one or more of the fasteners 240 and 242 and/or the counterpart fasteners 244 and 246 may be positioned at a different side of the RF coil assembly 200 relative to other fasteners and/or counterpart fasteners. For example, as shown by FIG. 2, fasteners 240 and 242 are positioned at the outer side of the RF coil assembly 200, and as shown by FIG. 3, counterpart fasteners 244 and 246 are positioned at the inner side of the RF coil assembly 200 (e.g., the side of the RF coil assembly 200 including inner surfaces configured to be in direct contact with the body of the patient, such as inner surface 298). The fasteners positioned at the outer side of the RF coil assembly 200 are configured to engage with the counterpart fasteners 244 positioned at the inner side of the RF coil assembly 200. In other examples, the fasteners and counterpart fasteners may be positioned at a same side of the RF coil assembly 200 (e.g., the outer side or the inner side).

Although the RF coils of the RF coil assembly 200 are shown by FIG. 2 and FIGS. 4-5, it should be noted that the RF coils may be embedded within a material of the RF coil assembly 200 and may not be visible to an observer (e.g., the patient or operator of the MRI system). The RF coils are shown by FIGS. 2-5 in order to illustrate a relative positioning and arrangement of the RF coils with respect to the posterior end 258, anterior end 260, and central section 280. For example, each of the posterior end 258, anterior end 260, and central section 280 (e.g., the body of the RF coil assembly 200) may be formed of a flexible material that is transparent to RF signals, such as one or more layers of meta-aramid material (e.g., Nomex® fabric). The RF coils of the posterior end 258, anterior end 260, and/or central section 280 may be embedded within the flexible material in some examples (e.g., fully enclosed by one or more layers of the flexible material). In other examples, the RF coils may be fixedly coupled to the RF coil assembly. For example, the RF coils of the posterior end 258 may be stitched or otherwise fixed (e.g., mounted, glued, fastened, etc.) to the material of the posterior end 258, the RF coils of the anterior end 260 may be stitched or otherwise fixed to the material of the anterior end 260, and/or the RF coils of the central section 280 may be stitched or otherwise fixed to the material of the central section 280. Because the body of the RF coil assembly 200 (e.g., the posterior end 258, anterior end 260, and central section 280) is formed of the flexible material, the body may be configured to wrap around a hip of the subject to be imaged (e.g., the patient). For example, portions of each of the posterior end 258 and anterior end 260 may overlap across the hip of the patient during conditions in which the RF coil assembly 200 is coupled to the patient for imaging of the patient (e.g., as shown by FIG. 6).

Further, each RF coil is coupled to corresponding coupling electronics (e.g., coupling electronics portions 238 coupled to first RF coil 206), and the corresponding coupling electronics (and the electrical wires coupled to the coupling electronics and/or RF coils) may be embedded within the flexible material along with the RF coils. For example, coupling electronics portion 238 of first RF coil 206 may be embedded within the material of posterior end 258. In other examples, the RF coils, coupling electronics, and/or electrical wires may be coupled (e.g., mounted) to the RF coil assembly 200 (e.g., mounted to posterior end 258, central section 280, and/or anterior end 260). The RF coils may bend and/or deform along with the flexible material without degradation of signals (e.g., RF signals) associated with the RF coils (e.g., signals used to image the patient with the MRI system via the RF coil assembly, as described above).

The RF coils of the posterior end 258, anterior end 260, and central section 280 are electrically coupled to a single output (e.g., a single coil-interfacing cable or cable harness) that is electrically coupleable to the MRI system. For example, FIG. 2 shows coil-interfacing cable 250 having an output connector 252 adapted to couple to the MRI system in order to transmit electrical signals from the RF coils of the RF coil assembly 200 to the MRI system. Each RF coil may be electrically coupled with the coil-interfacing cable 250 and output connector 252 via coupling electronics. Specifically, the coupling electronics of each RF coil (e.g., the RF coils of the posterior end 258, anterior end 260, and central section 280) may be electrically coupled to interface board 285 via wires, and interface board 285 may be electrically coupled with output connector 252 via coil-interfacing cable 250. For example, first RF coil 206 is electrically coupled to the interface board 285 via coupling electronics portion 238. Coupling electronics portion 238 may be electrically coupled to the interface board 285 via one or more wires (e.g., wire 286), and interface board 285 may transmit signals (e.g., electrical signals) from the coupling electronics portion 238 to the output connector 252 via coil-interfacing cable 250. In some examples, the wires may be embedded within the material of the RF coil assembly 200, and may extend toward the interface board 285 in order to electrically couple the coupling electronics of each RF coil with the interface board 285. Although the wires extending from the coupling electronics are shown by FIG. 2, the wires may be omitted from the other figures for illustrative purposes.

Coil-interfacing cable 250 may be electrically coupled to the interface board 285 via port 248 (e.g., an opening). For example, coil-interfacing cable 250 may include a plurality of wires adapted to transmit electrical signals from the interface board 285 to the output connector 252. In one example, coil-interfacing cable 250 and interface board 285 may be integrated together as a single piece, with the interface board 285 embedded within the material of the RF coil assembly 200 and with the coil-interfacing cable 250 extending outward from the RF coil assembly 200. In other examples, the port 248 may include a connector adapted to enable the coil-interfacing cable 250 to removably couple with the interface board 285. For example, coil-interfacing cable 250 may include an input connector shaped to couple with the connector at port 248. In this configuration, coil-interfacing cable 250 may be coupled to the interface board 285 (e.g., via the connector at port 248) during conditions in which the RF coil assembly 200 is utilized to image the patient via the MRI system, and the coil-interfacing cable 250 may be de-coupled from the interface board 285 (e.g., removed from the RF coil assembly 200) for replacement, maintenance, etc.

In some examples, port 248 and/or interface board 285 may be positioned at a center of the central section 280 and intersected by central axis 254. Further, port 248 and/or interface board 285 may be intersected by axis 256 positioned midway between axis 282 and axis 284. The center of the central section 280 is located at the intersection of central axis 254 and axis 256. Axis 256 is positioned perpendicular relative to central axis 254 and is parallel relative to axis 282 and axis 284. The axis 256 is equidistant from each of axis 282 and axis 284 such that the length 290 of the central section 280 in the direction of central axis 254 is bisected by the axis 256. In other examples, as shown by FIG. 2, the port 248 and/or interface board 285 may be offset relative to the center of central section 280 (e.g., offset along central axis 254, axis 256, or in a different direction).

The coil-interfacing cable 250 extends in an outward direction from the port 248 and interface board 285 (e.g., a direction away from the outer surfaces of the outer side of RF coil assembly 200, such as outer surface 295), with each of the RF coils of the RF coil assembly 200 electrically coupled to the output connector 252 via the coil-interfacing cable 250 (e.g., via the coupling electronics and interface board 285 as described above). Port 248 may be open at the outer side of the RF coil assembly 200 (e.g., the side shown by FIG. 2) and may be closed at the inner side of the RF coil assembly 200 (e.g., the side shown by FIG. 3). In some examples, the port 248 may be encircled by each of the tenth RF coil 224 and eleventh RF coil 226. As one example, the tenth RF coil 224 and eleventh RF coil 226 may overlap each other as shown by FIG. 2 and described above, and the port 248 may be positioned within the overlapping region of the tenth RF coil 224 and eleventh RF coil 226.

During conditions in which the RF coil assembly 200 is coupled to the patient (e.g., worn by the patient), the coil-interfacing cable 250 may extend in the outward direction from the RF coil assembly 200 between the legs of the patient, as shown by FIGS. 4-5. FIG. 4 shows a front view of patient 300, and FIG. 5 shows a rear view of patient 300. Chest 302 of the patient 300 is shown by FIG. 4, and back 400 of the patient 300 is shown by FIG. 5. The RF coil assembly 200 is worn by the patient 300, and the coil-interfacing cable 250 may extend outward from the RF coil assembly 200 away from the chest 302 and back 400 between right leg 402 and left leg 404 of the patient 300, and the port 248 (shown by FIG. 2) may be positioned between the right leg 402 and the left leg 404. In this position, the coil-interfacing cable 250 may more easily be coupled to the MRI system for imaging of the patient 300. Further, by configuring the coil-interfacing cable 250 to extend outward from the port 248 and interface board 285 (shown by FIG. 2) at the central section 280 of the RF coil assembly 200, the output connector 252 may be more easily electrically coupled with the RF coils of the RF coil assembly 200 (e.g., a length of wires extending from the coupling electronics portion of each RF coil to the coil-interfacing cable 250 may be reduced due to the centered position of the coil-interfacing cable 250). However, in other examples, the port 248 and coil-interfacing cable 250 may be positioned at a different location relative to the central section 280. For example, port 248 and coil-interfacing cable 250 may be positioned at the anterior end 260 or posterior end 258 of the RF coil assembly 200.

In some examples, the RF coil assembly 200 may include more than one coil-interfacing cable. For example, RF coil assembly 200 may include two coil-interfacing cables similar to the coil-interfacing cable 250, with a first coil-interfacing cable electrically coupled to the RF coils of the anterior end 260, and with a second coil-interfacing cable electrically coupled to the RF coils of the posterior end 258. Further, one of the first coil-interfacing cable or second coil-interfacing cable may be electrically coupled to the RF coils of the central section 280. The first coil-interfacing cable and second coil-interfacing cable may each extend outward from the RF coil assembly 200 via separate ports of the RF coil assembly 200. As one example, the RF coil assembly 200 may include a first port and a second port similar each similar to port 248, with the first coil-interfacing cable extending outward from the first port and with the second coil-interfacing cable extending outward from the second port. The first port and second port may be offset from each other (e.g., spaced apart from each other by a length of the RF coil assembly 200). In one example, the first port and second port are each positioned at the central section 280. In another example, one or both of the first port and second port may be positioned at the anterior end 260 or posterior end 258 (e.g., the first port may be positioned at the posterior end 258 and the second port may be positioned at the anterior end 260). As another example, the first port may be positioned at the central section 280 and the second port may be positioned at the anterior end 260 or posterior end 258. Other examples are possible.

The first coil-interfacing cable and second coil-interfacing cable may each be electrically coupled to a same interface board in one example (e.g., interface board 285). In another example, the first coil-interfacing cable may be electrically coupled to a first interface board (e.g., similar to interface board 285), and the second coil-interfacing cable may be electrically coupled to a second interface board. The first interface board may be positioned at the first port and the second interface board may be positioned at the second port. In some examples, the first coil-interfacing cable and first interface board may be integrated together as a single piece, with the first interface board embedded within the material of the RF coil assembly 200 and with the first coil-interfacing cable electrically coupled to the first interface board and extending outward from the first port of the RF coil assembly 200. Similarly, the second coil-interfacing cable and second interface board may be integrated together as a single piece, with the second interface board embedded within the material of the RF coil assembly 200 and with the second coil-interfacing cable electrically coupled to the second interface board and extending outward from the second port of the RF coil assembly 200. In other examples, the first port may include a connector adapted to enable the first coil-interfacing cable to removably couple with the first interface board, and/or the second port may include a connector adapted to enable the second coil-interfacing cable to removably couple with the second interface board, similar to the example of coil-interfacing cable 250 and interface board 285 described above.

In yet another example, the RF coil assembly may include three coil-interfacing cables, with a first coil-interfacing cable electrically coupled to the RF coils of the anterior end 260, a second coil-interfacing cable electrically coupled to the RF coils of the posterior end 258, and a third coil-interfacing cable electrically coupled to the RF coils of the central section 280. The first coil-interfacing cable may extend outward from a first port of the RF coil assembly 200 (e.g., similar to port 248) and may be electrically coupled to a first interface board (e.g., interface board 285), the second coil-interfacing cable may extend outward from a second port of the RF coil assembly 200 and may be electrically coupled to a second interface board, and the third coil-interfacing cable may extend outward from a third port of the RF coil assembly 200 and may be electrically coupled to a third interface board. Similar to the example described above, two or more of the coil-interfacing cables may be electrically coupled to a same interface board in some examples, and/or one or more of the ports may be positioned at a different location of the RF coil assembly 200 (e.g., anterior end 260, posterior end 258, or central section 280) than one or more other ports of the RF coil assembly 200. Other examples are possible.

FIG. 6 shows an enlarged perspective view of a portion of the patient 300, with the RF coil assembly 200 coupled to the patient 300. Coil-interfacing cable 250 is not shown by FIG. 6 for illustrative purposes. In FIG. 6, third extension 274 is shown coupled to first extension 270 in order to maintain the position of the RF coil assembly 200 relative to the body of the patient 300. Specifically, the fastener 240 is coupled to counterpart fasteners 246 (shown by FIG. 3, not shown by FIG. 6) in order to maintain engagement of the third extension 274 with the first extension 270. The third extension 274 and first extension 270 overlap each other across the left leg 404 of the patient 300. The second extension 272 and fourth extension 276 (shown by FIGS. 2-3) overlap each other across the right leg 402 of the patient 300 in a similar way (not shown by FIG. 6).

Axis 700 is shown tangential to a lowest portion of the RF coil assembly 200 while the RF coil assembly 200 is coupled to the patient 300. Specifically, axis 700 is tangential to a portion of the central section 280 (shown by FIGS. 2-3) at a lowest vertical position of the RF coil assembly 200 (e.g., relative to a vertical axis 320 of the patient 300 extending from the feet of the patient 300 to the head of the patient 300) while the RF coil assembly 200 is coupled to the patient 300. In one example, port 248 (shown by FIG. 2) may be at a same vertical position (e.g., a same position along the vertical axis 320) as the axis 700 during conditions in which the RF coil assembly 200 is coupled to the patient 300. In this configuration, the coil-interfacing cable 250 extends outward from the lowest portion (e.g., bottom-most portion along vertical axis 320) of the RF coil assembly 200 at axis 700 between the right leg 402 and left leg 404 of the patient 300 while the RF coil assembly 200 is worn by the patient 300.

In the configurations described above with reference to FIGS. 2-6, the RF coil assembly 200 may increase SNR, fit a wider range of patients as if specially tailored to them, and allow for difficult scans of the prostate, groin, and/or surrounding anatomy to result in cleaner images. The RF coil assembly 200 may also be lighter in weight than conventional RF coil assemblies, and may be easier to store when not in use.

Figure 13:
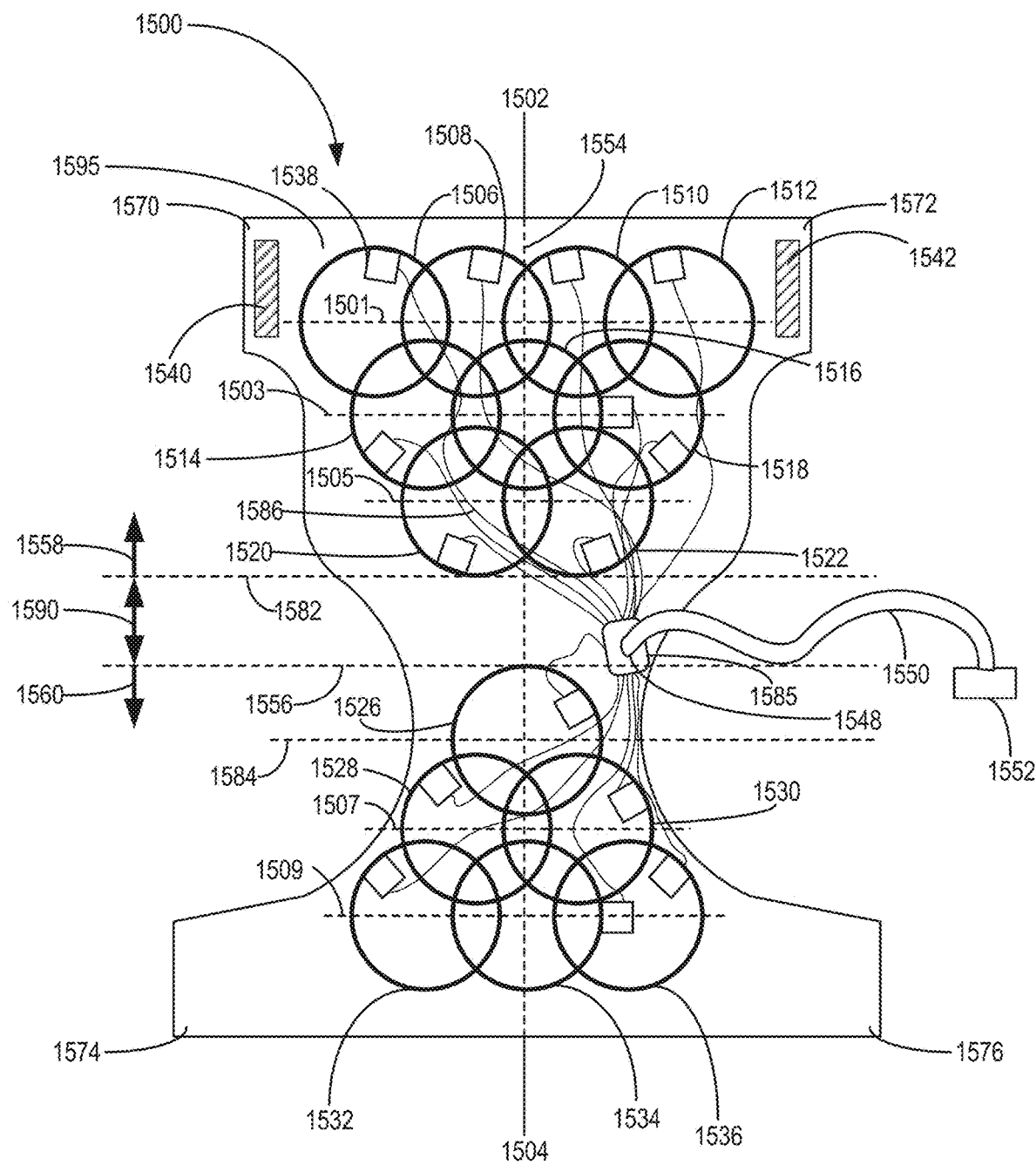
FIG. 13 shows an outer side of a second RF coil assembly for an MRI system.

Turning momentarily to FIG. 13, a second RF coil assembly 1500 is shown. The RF coil assembly 1500 (which may be referred to herein as a wearable RF coil assembly) may be similar to the RF coil unit 14 described above with reference to FIG. 1. FIG. 13 shows an outer side of the RF coil assembly 1500, similar to the view of the outer side of the RF coil assembly 200 shown by FIG. 2. RF coil assembly 1500 additionally includes an inner side which may be similar to the inner side of the RF coil assembly 200 shown by FIG. 3. For example, the inner side of RF coil assembly 1500 may include one or more pads similar to pad 297 and/or counterpart fasteners adapted to engage with fasteners of the RF coil assembly 1500 positioned at the outer side of RF coil assembly 1500 (e.g., fasteners 1540 and/or fasteners 1542).

RF coil assembly 1500 may include several components similar to those described above with reference to RF coil assembly 200. Specifically, RF coil assembly 1500 includes posterior edge 1502, anterior edge 1504, outer surface 1595, first extension 1570, second extension 1572, third extension 1574, fourth extension 1576, interface board 1585, coil-interfacing cable 1550, connector 1552, fasteners 1540, fasteners 1542, and port 1548, similar to posterior edge 202, anterior edge 204, outer surface 295, first extension 270, second extension 272, third extension 274, fourth extension 276, interface board 285, coil-interfacing cable 250, connector 252, fasteners 240, fasteners 242, and port 248, respectively, described above with reference to RF coil assembly 200. Further, central axis 1554 of RF coil assembly 1500 may be similar to central axis 254 of RF coil assembly 200. The RF coil assembly 1500 includes a plurality of flexible RF coils similar to the RF coils described below with reference to FIGS. 7-12. One or more of the RF coils of the RF coil assembly 1500 may be similar to the RF coils of the RF coil assembly 200. For example, a diameter of one or more of the RF coils of the RF coil assembly 1500 may be similar to a diameter of one or more of the RF coils of the RF coil assembly 200 (e.g., 10 centimeters, 11 centimeters, etc.). Further, an eccentricity of one or more of the RF coils of the RF coil assembly 1500 may be similar to an eccentricity of one or more of the RF coils of the RF coil assembly 200 (e.g., similar to first RF coil 206, tenth RF coil 224, etc. shown by FIG. 2). Each of the RF coils of the RF coil assembly 1500 includes coupling electronics (e.g., coupling electronics 1538) similar to the coupling electronics 238 described above with reference to RF coil assembly 200.

Similar to the arrangement of RF coils described above with reference to RF coil assembly 200, the RF coils of the RF coil assembly 1500 may be arranged into different rows. RF coil assembly 1500 includes a total of fifteen RF coils. Nine of the RF coils are arranged into a first RF coil array (which may be referred to herein as an RF coil set) at a posterior end 1558 of the RF coil assembly 1500, with the first RF coil set including first RF coil 1506, second RF coil 1508, third RF coil 1510, fourth RF coil 1512, fifth RF coil 1514, sixth RF coil 1516, seventh RF coil 1518, eighth RF coil 1520, and ninth RF coil 1522.

The RF coils of the first RF coil set may be arranged to form several rows of RF coils. Specifically, first RF coil 1506, second RF coil 1508, third RF coil 1510, and fourth RF coil 1512 may form a first row of RF coils at the posterior end 1558, fifth RF coil 1514, sixth RF coil 1516 and seventh RF coil 1518 may form a second row of RF coils at the posterior end 1558, and eighth RF coil 1520 and ninth RF coil 1522 may form a third row of RF coils at the posterior end 1558. The RF coils of the first row may be centered along axis 1501, the RF coils of the second row may be centered along axis 1503, and the RF coils of the third row may be centered along axis 1505. Axis 1501, axis 1503, and axis 1505 may be in a similar arrangement (e.g., offset from each other by a same amount of length and positioned parallel with each other) relative to axis 201, axis 203, and axis 205 shown by FIG. 2. For example, a length between axis 1501 and posterior edge 1502 in a direction perpendicular to axis 1501 may be a same amount of length as a length between axis 201 and posterior edge 202 in a direction perpendicular to axis 201.

In other examples, the RF coils at the posterior end 1558 may be in a different arrangement (e.g., not arranged in rows). Similar to the example described above with reference to posterior end 258 of RF coil assembly 200, the posterior end 1558 of RF coil assembly 1500 is configured to be positioned at a posterior side of a patient during conditions in which the RF coil assembly 1500 is coupled to the patient for imaging of the patient via an MRI system (e.g., the MRI apparatus described above with reference to FIG. 1).

An anterior end 1560 of the RF coil assembly 1500 includes six RF coils forming a second RF coil array (which may be referred to herein as an RF coil set). Specifically, anterior end 1560 includes tenth RF coil 1526, eleventh RF coil 1528, twelfth RF coil 1530, thirteenth RF coil 1532, fourteenth RF coil 1534, and fifteenth RF coil 1536. The RF coils of the anterior end 1560 may be arranged into several rows. For example, thirteenth RF coil 1532, fourteenth RF coil 1534, and fifteenth RF coil 1536 may form a first row of RF coils of the anterior end 1560, eleventh RF coil 1528 and twelfth RF coil 1530 may form a second row of RF coils of the anterior end 1560, and tenth RF coil 1526 may form a third row of RF coils of the anterior end 1560. The RF coils of the first row at the anterior end 1560 may be centered along axis 1509, the RF coils of the second row at the anterior end 1560 may be centered along axis 1507, and the RF coil of the third row at the anterior end 1560 may be centered along axis 1584. In one example, the axis 1509 and axis 1507 may be in a similar arrangement (e.g., offset from each other by a same amount of length and positioned parallel to each other) relative to the axis 209 and axis 207 shown by FIG. 2 and described above. For example, a length between axis 1509 and anterior edge 1504 in a direction perpendicular to axis 1509 may be a same amount of length as a length between axis 209 and anterior edge 204 in a direction perpendicular to axis 209.

The RF coil assembly 1500 does not include RF coils positioned within a central section 1590 of the RF coil assembly 1500. Specifically, central section 1590 is a portion of the RF coil assembly 1500 between the anterior end 1560 and the posterior end 1558 that does not include any RF coils. The posterior end 1558 is bounded by axis 1582 and posterior edge 1502, and the anterior end 1560 is bounded by axis 1556 and the anterior edge 1504. Posterior edge 1502 may be referred to herein as a terminating edge of the posterior end 1558 (e.g., an edge defining a boundary of the posterior end 1558), and anterior edge 1504 may be referred to herein as a terminating edge of the anterior end 1560 (e.g., an edge defining a boundary of the anterior end 1560). Central section 1590 is bounded by axis 1582 and axis 1556. Similar to the RF coils described above with reference to RF coil assembly 200, one or more of the RF coils of the RF coil assembly 1500 may have a different size (e.g., diameter) or eccentricity relative to one or more other RF coils of the RF coil assembly 1500.

In some examples, the RF coil assembly 1500 may include more than one coil-interfacing cable. For example, RF coil assembly 1500 may include two coil-interfacing cables similar to the coil-interfacing cable 1550, with a first coil-interfacing cable electrically coupled to the RF coils of the anterior end 1560, and with a second coil-interfacing cable electrically coupled to the RF coils of the posterior end 1558. The first coil-interfacing cable and second coil-interfacing cable may each extend outward from the RF coil assembly 1500 via separate ports of the RF coil assembly 1500. As one example, the RF coil assembly 1500 may include a first port and a second port similar each similar to port 1548, with the first coil-interfacing cable extending outward from the first port and with the second coil-interfacing cable extending outward from the second port. The first port and second port may be offset from each other (e.g., spaced apart from each other by a length of the RF coil assembly 1500). In one example, one or both of the first port and second port may be positioned at the anterior end 1560 or posterior end 1558. As another example, the first port may be positioned at the posterior end 1558 and the second port may be positioned at the anterior end 1560. As another example, the first port and/or second port may be positioned at the central section 1590. Other examples are possible.

Configuring the RF coil assembly 1500 to include fifteen RF coils may reduce a cost of the RF coil assembly 1500 relative to RF coil assemblies that include a larger number of RF coils. Further, by including nine RF coils at the posterior end 1558 and six RF coils at the anterior end 1560, an imaging quality of the RF coil assembly 1500 (e.g., a quality of images produced by the MRI system during conditions in which the RF coil assembly 1500 is coupled to the patient to image the body of the patient) may be increased. For example, configuring the posterior end 1558 to include a larger number of RF coils than the anterior end 1560 may enable an operator of the MRI system to more easily image the prostate of the patient during conditions in which the RF coil assembly 1500 is coupled to the patient for imaging of the patient.

Figure 7:
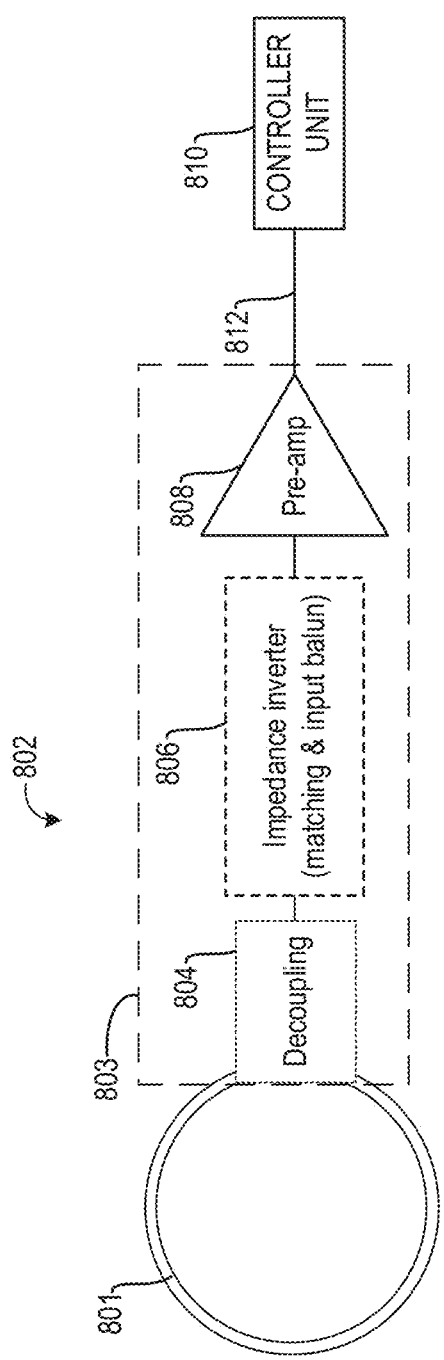
FIG. 7 schematically shows an example RF coil of an RF coil array coupled to a controller unit.

Turning now to FIG. 7, a schematic view of an RF coil 802 including a loop portion 801 coupled to a controller unit 810 via coupling electronics portion 803 and a coil-interfacing cable 812 is shown. In one example, the RF coil may be a surface receive coil, which may be single- or multi-channel. The RF coil 802 is one non-limiting example of RF coils included by RF coil unit 14 of FIG. 1 (e.g., similar to the RF coils included by RF coil assembly 200 described above) and as such may operate at one or more frequencies in the MRI apparatus 10 and the like. The coil-interfacing cable 812 may be a coil-interfacing cable extending between the electronics portion 803 and an interfacing connector of an RF coil array (e.g., RF coil set) or a RF coil array interfacing cable (e.g., RF coil set interfacing cable) extending between the interfacing connector of the RF coil array and the MRI system controller unit 810. The controller unit 810 may be associated with and/or may be a non-limiting example of the data processing unit 31 or controller unit 25 in FIG. 1.

The RF coil of the present disclosure includes a significantly smaller amount of copper, printed circuit board (PCB) material and electronic components than used in a conventional RF coil and includes paralleled elongated wire conductors, encapsulated and separated by a dielectric material, forming the coil element. The parallel wires form a low reactance structure without discrete capacitors. The minimal conductor, sized to keep losses tolerable, eliminates much of the capacitance between coil loops, and reduces electric field coupling. By interfacing with a large sampling impedance, currents are reduced and magnetic field coupling is minimized. The electronics are minimized in size and content to keep mass and weight low and prevent excessive interaction with the desired fields. Packaging can now be extremely flexible which allows contouring to anatomy, optimizing signal to noise ratio (SNR) and imaging acceleration.

A conventional RF receive coil for MR is comprised of several conductive intervals joined between themselves by capacitors. By adjusting the capacitors' values, the impedance of the RF coil may be brought to its minimal value, usually characterized by low resistance. At resonant frequency, stored magnetic and electric energy alternate periodically. Each conductive interval, due to its length and width, possesses a certain self-capacitance, where electric energy is periodically stored as static electricity. The distribution of this electricity takes place over the entire conductive interval length of the order of 5-15 cm, causing similar range electric dipole field. In a proximity of a large dielectric load, self-capacitance of the intervals change—hence detuning of the coil. In case of a lossy dielectric, dipole electric field causes Joule dissipation characterized by an increase overall resistance observed by the coil.

In contrast, the RF coil of the present disclosure represents almost an ideal magnetic dipole antenna as its common mode current is uniform in phase and amplitude along its perimeter. The capacitance of the RF coil is built between the two wires along the perimeter of the loop. The conservative electric field is strictly confined within the small cross-section of the two parallel wires and dielectric filler material. In the case of two RF coil loops overlapping, the parasitic capacitance at the cross-overs is greatly reduced in comparison to two overlapped copper traces of conventional RF coils. RF coil thin cross-sections allows increased magnetic decoupling and reduces or eliminates overlap between two loops in comparison to two conventional trace-based coil loops.

The coupling electronics portion 803 may be coupled to the loop portion of the RF coil 802. Herein, the coupling electronics portion 803 may include a decoupling circuit 804, impedance inverter circuit 806, and a pre-amplifier 808. The decoupling circuit 804 may effectively decouple the RF coil during a transmit operation. Typically, the RF coil 802 in its receive mode may be coupled to a body of a subject being imaged by the MR apparatus in order to receive echoes of the RF signal transmitted during the transmit mode. If the RF coil 802 is not used for transmission, RF coil 802 may be decoupled from the RF body coil while the RF body coil is transmitting the RF signal. The decoupling of the receive coil from the transmit coil may be achieved using resonance circuits and PIN diodes, microelectromechanical systems (MEMS) switches, or another type of switching circuitry. Herein, the switching circuitry may activate detuning circuits operatively connected to the RF coil 802.

The impedance inverter circuit 806 may form an impedance matching network between the RF coil 802 and the pre-amplifier 808. The impedance inverter circuit 806 is configured to transform a coil impedance of the RF coil 802 into an optimal source impedance for the pre-amplifier 808. The impedance inverter circuit 806 may include an impedance matching network and an input balun. The pre-amplifier 808 receives MR signals from the corresponding RF coil 802 and amplifies the received MR signals. In one example, the pre-amplifier may have a low input impedance that is configured to accommodate a relatively high blocking or source impedance. Additional details regarding the RF coil and associated coupling electronics portion will be explained in more detail below with respect to FIGS. 8 and 9. The coupling electronics portion 803 may be packaged in a very small PCB approximately 2 cm² in size or smaller. The PCB may be protected with a conformal coating or an encapsulating resin.

The coil-interfacing cable 812, such as an RF coil array interfacing cable, may be used to transmit signals between the RF coils and other aspects of the processing system, for example to control the RF coils and/or to receive information from the RF coils. The RF coil array interfacing cables may be disposed within the bore or imaging space of the MR apparatus (such as MRI apparatus 10 of FIG. 1) and subjected to electro-magnetic fields produced and used by the MRI apparatus. In MRI systems, coil-interfacing cables, such as coil-interfacing cable 812, may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents.

Thus, coil-interfacing cable 812 may include one or more baluns. In conventional coil-interfacing cables, baluns are positioned with a relatively high density, as high dissipation/voltages may develop if the balun density is too low or if baluns are positioned at an inappropriate location. However, this dense placement may adversely affect flexibility, cost, and performance. As such, the one or more baluns in the coil-interfacing cable may be continuous baluns to ensure no high currents or standing waves, independent of positioning. The continuous baluns may be distributed, flutter, and/or butterfly baluns. Additional details regarding the coil-interfacing cable and baluns will be presented below with respect to FIGS. 10-12.

Figure 8:
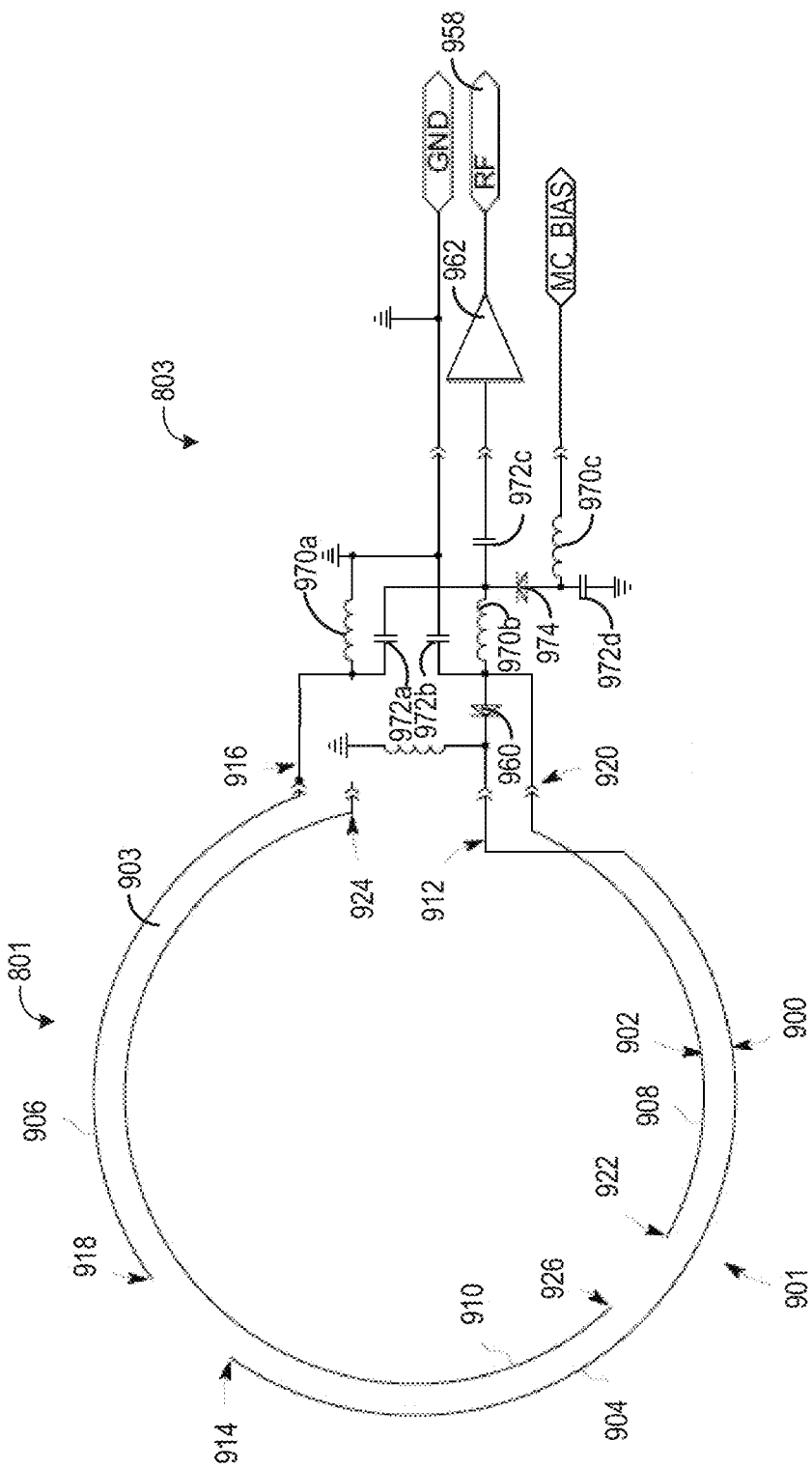
FIG. 8 shows a first example RF coil of an RF coil array and associated coupling electronics.

FIG. 8 is a schematic of an RF coil 901 having segmented conductors formed in accordance with an embodiment. RF coil 901 is a non-limiting example of RF coil 802 of FIG. 7 and as such includes loop portion 801 and coupling electronics portion 803 of RF coil 802. The coupling electronics portion allows the RF coil to transmit and/or receive RF signals when driven by the data acquisition unit 24 (shown in FIG. 1). In the illustrated embodiment, the RF coil 901 includes a first conductor 900 and a second conductor 902. The first and second conductors 900, 902 may be segmented such that the conductors form an open circuit (e.g., form a monopole). The segments of the conductors 900, 902 may have different lengths, as is discussed below. The length of the first and second conductors 900, 902 may be varied to achieve a select distributed capacitance, and accordingly, a select resonance frequency.

The first conductor 900 includes a first segment 904 and a second segment 906. The first segment 904 includes a driven end 912 at an interface terminating to coupling portion electronics 803, which will be described in more detail below. The first segment 904 also includes a floating end 914 that is detached from a reference ground, thereby maintaining a floating state. The second segment 906 includes a driven end 916 at the interface terminating to the coupling electronics portion and a floating end 918 that is detached from a reference ground.

The second conductor 902 includes a first segment 908 and a second segment 910. The first segment 908 includes a driven end 920 at the interface. The first segment 908 also includes a floating end 922 that is detached from a reference ground, thereby maintaining a floating state. The second segment 910 includes a driven end 924 at the interface, and a floating end 926 that is detached from a reference ground. The driven end 924 may terminate at the interface such that end 924 is only coupled to the first conductor through the distributed capacitance. The capacitors shown around the loop between the conductors represent the capacitance between the wires.

The first conductor 900 exhibits a distributed capacitance that grows based on the length of the first and second segments 904, 906. The second conductor 902 exhibits a distributed capacitance that grows based on the length of the first and second segments 908, 910. The first segments 904, 908 may have a different length than the second segments 906, 910. The relative difference in length between the first segments 904, 908 and the second segments 906, 910 may be used to produce an effective LC circuit have a resonance frequency at the desired center frequency. For example, by varying the length of the first segments 904, 908 relative to the lengths of the second segments 906, 910, an integrated distributed capacitance may be varied.

In the illustrated embodiment, the first and second conductors 900, 902 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors. The first and second conductors are void of any discrete or lumped capacitive or inductive elements along an entire length of the conductive pathway. The loop portion may also include loops of varying gauge of stranded or solid conductor wire, loops of varying diameters with varying lengths of the first and second conductors 900, 902, and/or loops of varying spacing between the first and second conductors. For example, each of the first and second conductors may have no cuts or gaps (no segmented conductors) or one or more cuts or gaps (segmented conductors) at various locations along the conductive pathway.

Distributed capacitance (DCAP), as used herein, represents a capacitance exhibited between conductors that grows evenly and uniformly along the length of the conductors and is void of discrete or lumped capacitive components and discrete or lumped inductive components. In the examples herein, the capacitance may grow in a uniform manner along the length of the first and second conductors 900, 902.

A dielectric material 903 encapsulates and separates the first and second conductors 900, 902. The dielectric material 903 may be selectively chosen to achieve a select distributive capacitance. The dielectric material 903 may be based on a desired permittivity $\epsilon$ to vary the effective capacitance of the loop portion. For example, the dielectric material 903 may be air, rubber, plastic, or any other dielectric material. In one example, the dielectric material may be polytetrafluoroethylene (pTFE). For example, the dielectric material 903 may be an insulating material surrounding the parallel conductive elements of the first and second conductors 900, 902. Alternatively, the first and second conductors 900, 902 may be twisted upon one another to form a twisted pair cable. As another example, the dielectric material 903 may be a plastic material. The first and second conductors 900, 902 may form a coaxial structure in which the plastic dielectric material 903 separates the first and second conductors. As another example, the first and second conductors may be configured as planar strips.

The coupling electronics 803 is operably and communicatively coupled to the RF driver unit 22, the data acquisition unit 24, controller unit 25, and/or data processing unit 31 to allow the RF coil 802 to transmit and/or receive RF signals. In the illustrated embodiment, the coupling electronics 803 includes a signal interface 958 configured to transmit and receive the RF signals.

As explained above with reference to FIG. 7, the coupling electronics 803 includes a decoupling circuit, impedance inverter circuit, and pre-amplifier. As illustrated in FIG. 8, the decoupling circuit includes a decoupling diode 960. The decoupling diode 960 may be provided with voltage from MC_BIAS, for example, in order to turn decoupling diode 960 on. When on, decoupling diode 960 causes conductor 900 to short with conductor 902, thus causing the coil be off-resonance and hence decouple the coil during a transmit operation, for example.

The impedance inverter circuit includes a plurality of inductors, including first inductor 970a, second inductor 970b, and third inductor 970c; a plurality of capacitors, including first capacitor 972a, a second capacitor 972b, a third capacitor 972c, and a fourth capacitor 972d; and a diode 974. The impedance inverter circuit includes matching circuitry and an input balun. As shown, the input balun is a lattice balun that comprises first inductor 970a, second inductor 970b, first capacitor 972a, and second capacitor 972b. In one example, diode 974 limits the direction of current flow to block RF receive signals from proceeding into decoupling bias branch (MC_BIAS).

In one example, the RF, GND, and MC_BIAS connections are part of a single cable. For example, the cable may be a triaxial cable with a center conductor and two surrounding shields. The center conductor may electrically conduct the RF signal and pre-amp control, a first shield may be the GND connection (e.g., ground), and a second, outermost shield may be the MC_BIAS connection (e.g., multi-coil bias for diode decoupling control). The cable may connect to an interface board (along with one or more other cables of RF coils), with a connector of the interface board electrically coupling the cable to the MRI system.

The pre-amplifier 962 may be a low input impedance pre-amplifier that is optimized for high source impedance by the impedance matching circuitry. The pre-amplifier may have a low noise reflection coefficient, γ, and a low noise resistance, Rn. In one example, the pre-amplifier may have a source reflection coefficient of γ substantially equal to 0.0 and a normalized noise resistance of Rn substantially equal to 0.0 in addition to the low noise figure. However, γ values substantially equal to or less than 0.1 and Rn values substantially equal to or less than 0.2 are also contemplated. With the pre-amplifier having the appropriate γ and Rn values, the pre-amplifier provides a blocking impedance for RF coil 901 while also providing a large noise circle in the context of a Smith Chart. As such, current in RF coil 901 is minimized, the pre-amplifier is effectively noise matched with RF coil 901 output impedance. Having a large noise circle, the pre-amplifier yields an effective SNR over a variety of RF coil impedances while producing a high blocking impedance to RF coil 901.

In some examples, the pre-amplifier 962 may include an impedance transformer that includes a capacitor and an inductor. The impedance transformer may be configured to alter the impedance of the pre-amplifier to effectively cancel out a reactance of the pre-amplifier, such as capacitance caused by a parasitic capacitance effect. Parasitic capacitance effects can be caused by, for example, a PCB layout of the pre-amplifier or by a gate of the pre-amplifier. Further, such reactance can often increase as the frequency increases. Advantageously, however, configuring the impedance transformer of the pre-amplifier to cancel, or at least minimize, reactance maintains a high impedance (e.g., a blocking impedance) to RF coil 901 and an effective SNR without having a substantial impact on the noise figure of the pre-amplifier. The lattice balun described above may be a non-limiting example of an impedance transformer.

In examples, the pre-amplifier described herein may a low input pre-amplifier. For example, in some embodiments, a "relatively low" input impedance of the preamplifier is less than approximately 5 ohms at resonance frequency. The coil impedance of the RF coil 901 may have any value, which may be dependent on coil loading, coil size, field strength, and/or the like. Examples of the coil impedance of the RF coil 901 include, but are not limited to, between approximately 2 ohms and approximately 10 ohms at 1.5 T magnetic field strength, and/or the like. The impedance inverter circuitry is configured to transform the coil impedance of the RF coil 901 into a relatively high source impedance. For example, in some embodiments, a "relatively high" source impedance is at least approximately 100 ohms and may be greater than 150 ohms.

The impedance transformer may also provide a blocking impedance to the RF coil 901. Transformation of the coil impedance of the RF coil 901 to a relative high source impedance may enable the impedance transformer to provide a higher blocking impedance to the RF coil 901. Exemplary values for such higher blocking impedances include, for example, a blocking impedance of at least 500 ohms, and at least 1000 ohms.

Figure 9:
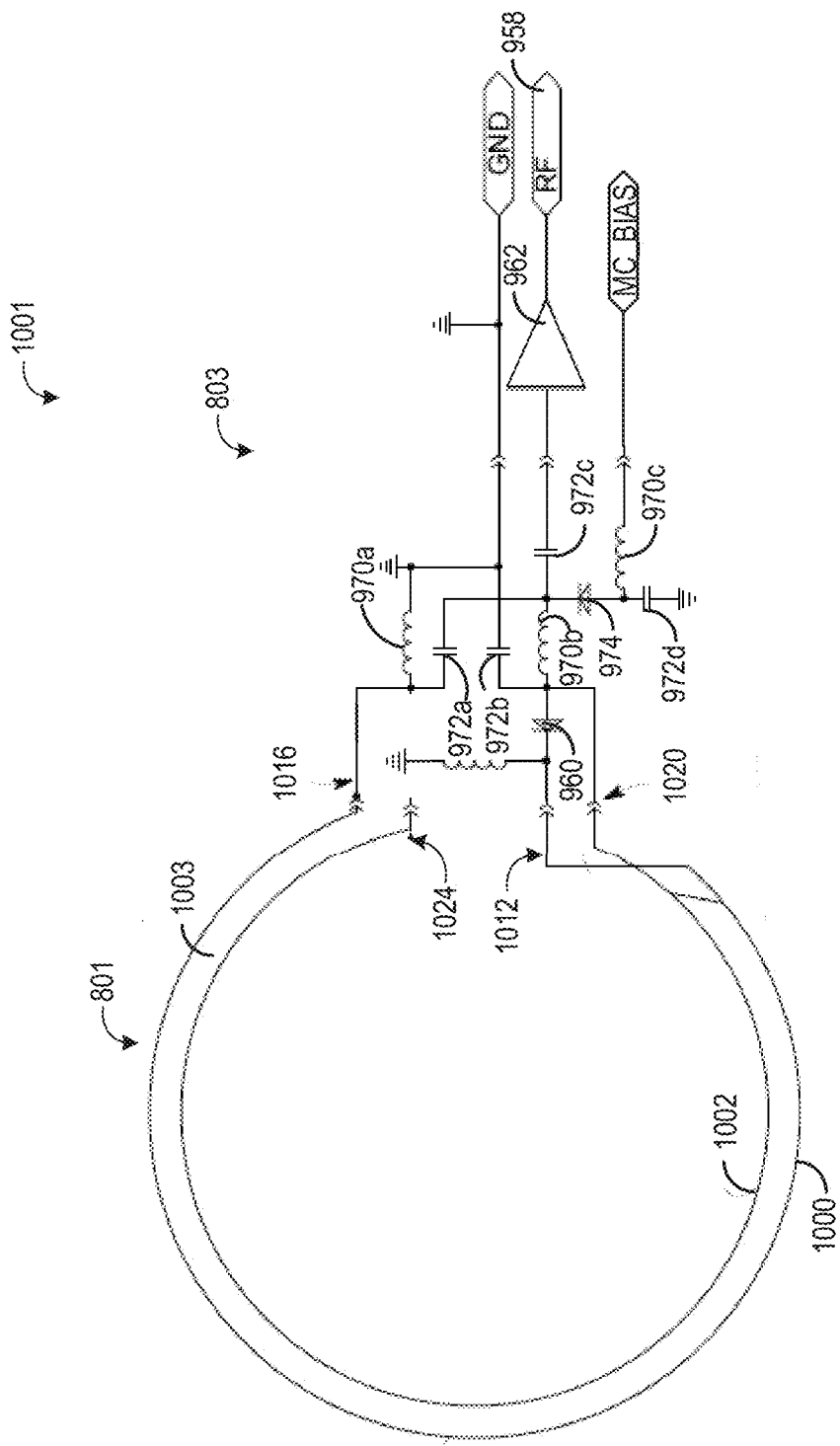
FIG. 9 shows a second example RF coil of an RF coil array and associated coupling electronics.
Figure 10:
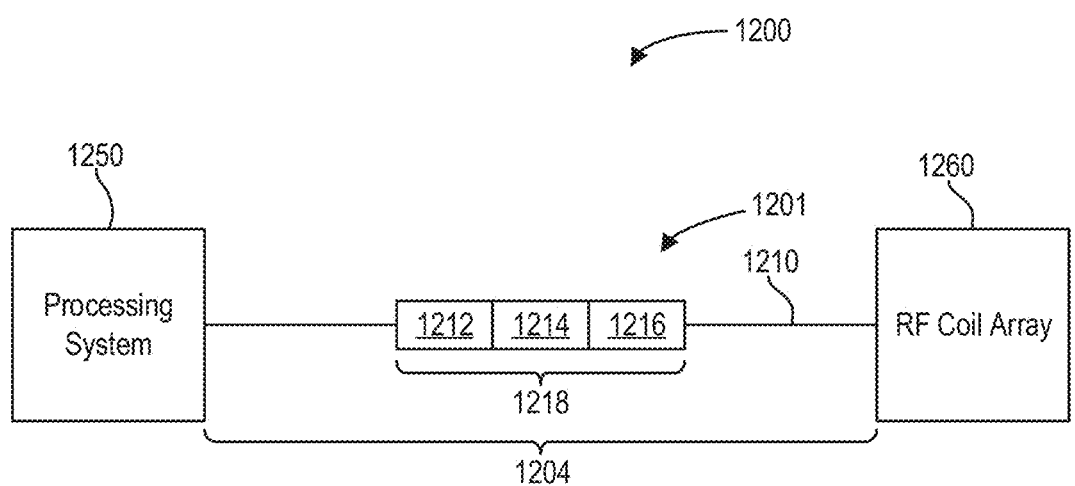
FIG. 10 schematically shows an example RF coil array interfacing cable including a plurality of continuous and/or contiguous common mode traps positioned between a processing system and an RF coil array of a MRI system.

FIG. 9 is a schematic of an RF coil 1001 and coupling electronics 803 according to another embodiment. The RF coil of FIG. 10 is a non-limiting example of the RF coil and coupling electronics of FIG. 7, and as such includes a loop portion 801 and coupling electronics portion 803. The coupling electronics allows the RF coil to transmit and/or receive RF signals when driven by the data acquisition unit 24 (shown in FIG. 1). The RF coil 1001 includes a first conductor 1000 in parallel with a second conductor 1002. At least one of the first and second conductors 1000, 1002 are elongated and continuous.

In the illustrated embodiment, the first and second conductors 1000, 1002 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors 1000, 1002. The first and second conductors 1000, 1002 are void of any discrete or lumped capacitive or inductive components along an entire length of the conductive pathway. The first and second conductors 1000, 1002 are uninterrupted and continuous along an entire length of the loop portion. The loop portion may also include loops of varying gauge of stranded or solid conductor wire, loops of varying diameters with varying lengths of the first and second conductors 1000, 1002, and/or loops of varying spacing between the first and second conductors. For example, each of the first and second conductors may have no cuts or gaps (no segmented conductors) or one or more cuts or gaps (segmented conductors) at various locations along the conductive pathway.

The first and second conductors 1000, 1002 have a distributed capacitance along the length of the loop portion (e.g., along the length of the first and second conductors 1000, 1002). The first and second conductors 1000, 1002 exhibit a substantially equal and uniform capacitance along the entire length of the loop portion. Distributed capacitance (DCAP), as used herein, represents a capacitance exhibited between conductors that grows evenly and uniformly along the length of the conductors and is void of discrete or lumped capacitive components and discrete or lumped inductive components. In the examples herein, the capacitance may grow in a uniform manner along the length of the first and second conductors 1000, 1002. At least one of the first and second conductors 1000, 1002 are elongated and continuous. In the illustrated embodiment, both the first and second conductors 1000, 1002 are elongated and continuous. But in other embodiments, only one of the first or second conductors 1000, 1002 may be elongated and continuous. The first and second conductors 1000, 1002 form continuous distributed capacitors. The capacitance grows at a substantially constant rate along the length of the conductors 1000, 1002. In the illustrated embodiment, the first and second conductors 1000, 1002 forms an elongated continuous conductors that exhibits DCAP along the length of the first and second conductors 1000, 1002. The first and second conductors 1000, 1002 are void of any discrete capacitive and inductive components along the entire length of the continuous conductors between terminating ends of the first and second conductors 1000, 1002. For example, the first and second conductors 1000, 1002 does not include any discrete capacitors, nor any inductors along the length of the loop portion.

A dielectric material 1003 separates the first and second conductors 1000, 1002. The dielectric material 1003 may be selectively chosen to achieve a select distributive capacitance. The dielectric material 1003 may be based on a desired permittivity ε to vary the effective capacitance of the loop portion. For example, the dielectric material 1003 may be air, rubber, plastic, or any other dielectric material. In one example, the dielectric material may be polytetrafluoroethylene (pTFE). For example, the dielectric material 1003 may be an insulating material surrounding the parallel conductive elements of the first and second conductors 1000, 1002. Alternatively, the first and second conductors 1000, 1002 may be twisted upon one another to from a twisted pair cable. As another example, the dielectric material 1003 may be a plastic material. The first and second conductors 1000, 1002 may form a coaxial structure in which the plastic dielectric material 1003 separates the first and second conductors 1000, 1002. As another example, the first and second conductors 1000, 1002 may be configured as planar strips.

The first conductor 1000 includes a first terminating end 1012 and a second terminating end 1016 that terminates at the interface. The first terminating end 1012 is coupled to the coupling electronics 803. The first terminating end 1012 may also be referred to herein as a "drive end." The second terminating end 1016 is also referred to herein as a "second drive end."

The second conductor 1002 includes a first terminating end 1020 and a second terminating end 1024 that terminates at the interface. The first terminating end 1020 is coupled to the coupling electronics 803. The first terminating end 1020 may also be referred to herein as a "drive end." The second terminating end 1024 is also referred to herein as a "second drive end."

The loop portion 801 of the RF coil 1001 is coupled to coupling electronics 803. The coupling electronics 803 may be the same coupling electronics described above with respect to FIGS. 7 and 8, and hence like reference numbers are given to like components and further description is dispensed with.

As appreciated by FIGS. 8 and 9, the two parallel conductors comprising the loop portion of an RF coil may each be continuous conductors, as illustrated in FIG. 9, or one or both of the conductors may be non-continuous, as illustrated in FIG. 8. For example, both conductors shown in FIG. 8 may include cuts, resulting in each conductor being comprised of two segments. The resulting space between conductor segments may be filled with the dielectric material that encapsulates and surrounds the conductors. The two cuts may be positioned at different locations, e.g., one cut at 135° and the other cut at 225° (relative to where the loop portion interfaces with the coupling electronics). By including discontinuous conductors, the resonance frequency of the coil may be adjusted relative to a coil that includes continuous conductors. In an example, an RF coil that includes two continuous parallel conductors encapsulated and separated by a dielectric, the resonance frequency may be a smaller, first resonance frequency. If that RF coil instead includes one discontinuous conductor (e.g., where one of the conductors is cut and filled with the dielectric material) and one continuous conductor, with all other parameters (e.g., conductor wire gauge, loop diameter, spacing between conductors, dielectric material) being the same, the resonance frequency of the RF coil may be a larger, second resonance frequency. In this way, parameters of the loop portion, including wire gauge, loop diameter, spacing between wire conductors, dielectric material selection and/or thickness, and conductor segment number and lengths, may be adjusted to tune the RF coil to a desired resonance frequency.

The RF coils presented above with respect to FIGS. 7-9 may be utilized in order to receive MR signals during an MR imaging session. As such, the RF coils of FIGS. 7-9 may be non-limiting examples of RF coils included by RF coil unit 14 of FIG. 1 (and may be similar to RF coils included by RF coil assembly 200, described above) and may be configured to be coupled to a downstream component of the MRI system, such as a processing system. The RF coils of FIGS. 7-9 may be present in an array (e.g., set) of RF coils having various configurations. Various configurations of RF coils and accompanying coil-interfacing cables similar to the RF coils described above with respect to FIGS. 7-9 may be possible, as described below.

An RF coil array (e.g., RF coil set) including RF coils similar to those described above may include a coil loop and an electronics unit coupled to each coil, and a coil-interfacing cable connected to and extending from each coupling electronics unit. Accordingly, the RF coil array may include (for example) four coil loops, four electronics units, and four coil-interfacing cables. A different, second RF coil array may include a separate electronics unit for each coil loop, with each electronics unit coupled to a respective coil-interfacing cable. The second RF coil array may include four coil loops, four electronics units, and four coil-interfacing cables (for example) that are bundled together in a single grouping of four coil-interfacing cables, and may be referred to as an integrated balun cable harness. Each coil-interfacing cable coupled to a respective electronics unit may combine into one overall coil-interfacing cable, also referred to as a cable assembly.

The individual coupling electronics units may be housed in a common electronics housing in some examples. Each coil loop of the coil array may have respective coupling electronics unit (e.g., a decoupling circuit, impedance inverter circuit, and pre-amplifier) housed in the housing. In some examples, the common electronics housing may be detachable from the coil loop or RF coil array. In one example, the electronics may be placed in a separable assembly and disconnected from the RF coil array. A connector interface could be placed at, for example, the junctions between the conductor loop portions (e.g., the drive ends described above) and the coupling electronics for each individual coupling electronics unit.

The wire conductors and coil loops used in the RF coils or RF coil arrays described herein may be manufactured in any suitable manner to get the desired resonance frequency for a desired RF coil application. The desired wire gauge, such as 28 or 30 American Wire Gauge (AWG) or any other desired wire gauge may be paired with a parallel wire of the same gauge and encapsulated with a dielectric material using an extrusion process or a three-dimensional (3D) printing or additive manufacturing process. This manufacturing process may be environmentally friendly with low waste and low-cost.

Thus, the RF coils described herein includes a twin lead wire conductor loop encapsulated in a pTFE dielectric that may have no cuts or with at least one cut in at least one of the two parallel wire conductors and a miniaturized coupling electronics PCB coupled to each coil loop (e.g., very small coupling electronics PCB approximately the sizer of 2 cm² or smaller). The PCBs may be protected with a conformal coating or an encapsulation resin. In doing so, conventional components are eliminated and capacitance is "built in" the integrated capacitor (INCA) coil loops. Interactions between coil elements are reduced or eliminated. The coil loops are adaptable to a broad range of MR operating frequencies by changing the gauge of wire used, spacing between wires, loop diameters, loop shapes, and the number and placement of cuts in the wires.

The coil loops are transparent in PET/MR applications, aiding dose management and signal-to-noise ratios (SNR). The miniaturized coupling electronics PCB includes decoupling circuitry, impedance inverter circuitry with impedance matching circuitry and an input balun, and a pre-amplifier. The pre-amplifier sets new standards in coil array applications for lowest noise, robustness, and transparency. The pre-amplifier provides active noise cancelling to reduce current noise, boost linearity, and increase tolerance to varying coil loading conditions. Additionally, as explained in more detail below, a cable harness with baluns for coupling each of the miniaturized coupling electronics PCBs to the RF coil array connector that interfaces with the MRI system may be provided.

The RF coils described herein are exceptionally lightweight relative to convention RF coils. As one non-limiting example, a 16-channel RF coil array according to the disclosure may weigh less than 0.5 kg. The RF coils described herein are exceptionally flexible and durable as the coils are extremely simple with very few rigid components to damage and allowing floating overlaps. The RF coils described herein are exceptionally low cost (e.g., greater than a ten times reduction from conventional RF coils). As one non-limiting example, a 16-channel RF coil array could be comprised of components and materials of less than $50. The RF coils described herein do not preclude current packaging or emerging technologies and could be implemented in RF coil arrays that are not packaged or attached to a former, or implemented in RF coil arrays that are attached to flexible formers as flexible RF coil arrays or attached to rigid formers as rigid RF coil arrays.

The combination of an INCA coil loop and associated coupling electronics is a single coil element, which is functionally independent and electrically immune to its surrounding environment or neighboring coil elements. As a result, the RF coils described herein perform equally well in low and high-density coil array applications. The exceptional isolation between coil elements allows the overlap between coil elements to be maximized without degrading performance across coil elements. This allows for a higher density of coil elements than is possible with conventional RF coil array designs.

In some examples, the RF coils included by RF coil assembly 200 (as described above) may be positioned in a different relative arrangement than those shown by FIGS. 2-6. For example, the RF coils included by RF coil assembly 200 may be electrically coupled together as one or more sets (e.g., sub-arrays) of RF coils, and the one or more sets may include the RF coils positioned in various different arrangements relative to those shown by FIGS. 2-6.

FIG. 10 illustrates a block schematic diagram of a continuous common mode trap assembly 1200 formed in accordance with various embodiments. The common mode trap assembly 1200 may be configured as a transmission cable 1201 configured for transmission of signals between a processing system 1250 and an RF coil array (e.g., RF coil set) of an MRI system (e.g., the RF coil arrays of RF coil assembly 200, such as the RF coils of the posterior end 258, the RF coils of the anterior end 260, and the RF coils of the central section 280, or the RF coil arrays of RF coil assembly 1500). Transmission cable 1201 is a non-limiting example of an RF coil array interfacing cable 812, processing system 1250 is a non-limiting example of controller unit 810, and RF coil array 1260 is a non-limiting example of a plurality of RF coils 802 and coupling electronics 803 of FIG. 7.

In the illustrated embodiment, the transmission cable 1201 (or RF coil array interfacing cable) includes a central conductor 1210 and plural common mode traps 1212, 1214, 1216. It may be noted that, while the common mode traps 1212, 1214, and 1216 are depicted as distinct from the central conductor 1210, in some embodiments, the common mode traps 1212, 1214, 1216 may be integrally formed with or as a part of the central conductor 1210.

The central conductor 1210 in the illustrated embodiment has a length 1204, and is configured to transmit a signal between the RF coil array 1260 and at least one processor of an MRI system (e.g., processing system 1250). The central conductor 1210 may include one or more of a ribbon conductor, a wire, or a coaxial cable bundle, for example. The length 1204 of the depicted central conductor 1210 extends from a first end of the central conductor 1210 (which is coupled to the processing system 1250) to a second end of the central conductor 1210 (which is coupled to the RF coil array 1260). In some embodiments, the central conductor may pass through a central opening of the common mode traps 1212, 1214, 1216.

The depicted common mode traps 1212, 1214, 1216 (which may be understood as cooperating to form a common mode trap unit 1218), as seen in FIG. 10, extend along at least a portion of the length 1204 of the central conductor 1210. In the illustrated embodiment, common mode traps 1212, 1214, 1216 do not extend along the entire length 1204. However, in other embodiments, the common mode traps 1212, 1214, 1216 may extend along the entire length 1204, or substantially along the entire length 1204 (e.g., along the entire length 1204 except for portions at the end configured to couple, for example, to a processor or RF coil array). The common mode traps 1212, 1214, 1216 are disposed contiguously. As seen in FIG. 10, each of the common mode traps 1212, 1214, 1216 is disposed contiguously to at least one other of the common mode traps 1212, 1214, 1216. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than 1/40th of a wavelength of a transmit frequency in free space. In some embodiments, an insubstantial gap (or conductor length) may be understood as being two centimeters or less. Contiguous common mode traps, for example, have no (or insubstantial) intervening gaps or conductors therebetween that may be susceptible to induction of current from a magnetic field without mitigation provided by a common mode trap.

For example, as depicted in FIG. 10, the common mode trap 1212 is contiguous to the common mode trap 1214, the common mode trap 1214 is contiguous to the common mode trap 1212 and the common mode trap 1216 (and is interposed between the common mode trap 1212 and the common mode trap 1216), and the common mode trap 1216 is contiguous to the common mode trap 1214. Each of the common mode traps 1212, 1214, 1216 are configured to provide an impedance to the receive transmitter driven currents of an MRI system. The common mode traps 1212, 1214, 1216 in various embodiments provide high common mode impedances. Each common mode trap 1212, 1214, 1216, for example, may include a resonant circuit and/or one or more resonant components to provide a desired impedance at or near a desired frequency or within a target frequency range. It may be noted that the common mode traps 1212, 1214, 1216 and/or common mode trap unit 1218 may also be referred to as chokes or baluns by those skilled in the art.

In contrast to systems having separated discrete common mode traps with spaces therebetween, various embodiments (e.g., the common mode trap assembly 1200) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common mode trap unit 1218) may extend along a length or portion thereof of a transmission cable.

The continuous mode trap portion may be formed of contiguously joined individual common mode traps or trap sections (e.g., common mode traps 1212, 1214, 1216). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous and/or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 1212, 1214, 1216) in various embodiments may be constructed or formed generally similarly to each other (e.g., each trap may be a section of a length of tapered wound coils), but each individual trap or section may be configured slightly differently than other traps or sections. For example, in some embodiments, each common mode trap 1212, 1214, 1216 is tuned independently. Accordingly, each common mode trap 1212, 1214, 1216 may have a resonant frequency that differs from other common mode traps of the same common mode trap assembly 1200.

Alternatively or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to the operating frequency to provide on-frequency blocking, or to provide a blocking impedance at the operating frequency.

Further additionally or alternatively, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

In various embodiments, the common mode traps may have a two-dimensional (2D) or three-dimensional (3D) butterfly configuration to counteract magnetic field coupling and/or local distortions.

Figure 11:
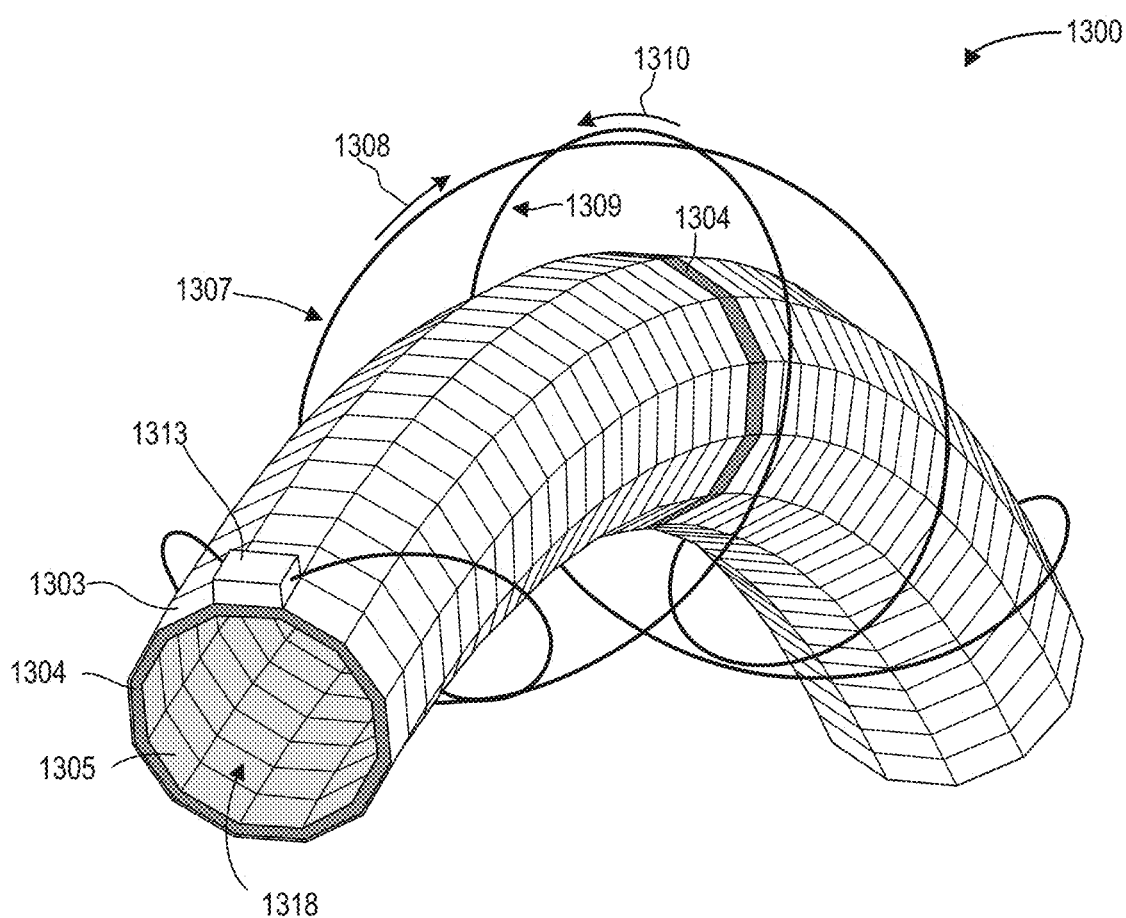
FIGS. 11 and 12 schematically show example RF coil array interfacing cables including a plurality of continuous and/or contiguous common mode traps.

FIG. 11 is a perspective view of an RF coil array interfacing cable 1300 including a plurality of continuous and/or contiguous common mode traps according to an embodiment of the disclosure. The RF coil array interfacing cable 1300 includes an outer sleeve or shield 1303, a dielectric spacer 1304, an inner sleeve 1305, a first common mode trap conductor 1307, and a second common mode trap conductor 1309.

The first common mode trap conductor 1307 is wrapped in a spiral about the dielectric spacer 1304, or wrapped in a spiral at a tapering distance from a central conductor (not shown) disposed within the bore 1318 of the RF coil array interfacing cable 1300, in a first direction 1308. Further, the second common mode trap conductor 1309 is wrapped in a spiral about the dielectric spacer 1304, or wrapped in a spiral at a tapering distance from the central conductor disposed within the bore 1318, in a second direction 1310 that is opposite to the first direction 1308. In the illustrated embodiment, the first direction 1308 is clockwise and the second direction 1310 is counter-clockwise.

The conductors 1307 and 1309 of the RF coil array interfacing cable 1300 may comprise electrically-conductive material (e.g., metal) and may be shaped as ribbons, wires, and/or cables, for example. In some embodiments, the counterwound or outer conductors 1307 and 1309 may serve as a return path for a current passing through the central conductor. Further, in various embodiments, the counterwound conductors 1307 and 1309 may cross each other orthogonally (e.g., a center line or path defined by the first common mode trap conductor 1307 is perpendicular to a center line or path defined by the second common mode trap conductor 1309 as the common mode trap conductors cross paths) to eliminate, minimize, or reduce coupling between the common mode trap conductors.

It may be further noted that in various embodiments the first common mode trap conductor 1307 and the second common mode trap conductor 1309 are loosely wrapped about the dielectric spacer 1304 to provide flexibility and/or to reduce any binding, coupling, or variation in inductance when the RF coil array interfacing cable 1300 is bent or flexed. It may be noted that the looseness or tightness of the counterwound outer conductors may vary by application (e.g., based on the relative sizes of the conductors and dielectric spacer, the amount of bending or flexing that is desired for the common mode trap, or the like). Generally, the outer or counterwound conductors may be tight enough so that they remain in the same general orientation about the dielectric spacer 1304, but loose enough to allow a sufficient amount of slack or movement during bending or flexing of the RF coil array interfacing cable 1300 to avoid, minimize, or reduce coupling or binding of the counterwound outer conductors.

In the illustrated embodiment, the outer shielding 1303 is discontinuous in the middle of the RF coil array interfacing cable 1300 to expose a portion of the dielectric spacer 1304 which in some embodiments is provided along the entire length of the RF coil array interfacing cable 1300. The dielectric spacer 1304, may be comprised, as a non-limiting example, of Teflon or another dielectric material. The dielectric spacer 1304 functions as a capacitor and thus may be tuned or configured to provide a desired resonance. It should be appreciated that other configurations for providing capacitance to the RF coil array interfacing cable 1300 are possible, and that the illustrated configurations are exemplary and non-limiting. For example, discrete capacitors may alternatively be provided to the RF coil array interfacing cable 1300.

Further, the RF coil array interfacing cable 1300 includes a first post 1313 and a second post (not shown) to which the first common mode trap conductor 1307 and the second common mode trap conductor 1309 are fixed. To that end, the first post 1313 and the second post are positioned at the opposite ends of the common mode trap, and are fixed to the outer shielding 1303. The first post 1313 and the second post ensure that the first and second common mode trap conductors 1307 and 1309 are positioned close to the outer shielding 1303 at the ends of the RF coil array interfacing cable 1300, thereby providing a tapered butterfly configuration of the counterwound conductors as described further herein.

The tapered butterfly configuration includes a first loop formed by the first common mode trap conductor 1307 and a second loop formed by the second common mode trap conductor 1309, arranged so that an induced current (a current induced due to a magnetic field) in the first loop 1307 and an induced current in the second loop 1309 cancel each other out. For example, if the field is uniform and the first loop 1307 and the second loop 1309 have equal areas, the resulting net current will be zero. The tapered cylindrical arrangement of the loops 1307 and 1309 provide increased flexibility and consistency of resonant frequency during flexing relative to two-dimensional arrangements conventionally used in common mode traps.

Generally, a tapered butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with reference to FIG. 10, in some embodiments, counterwound conductors (e.g., conductors wound about a central member and/or axis in opposing spiral directions) may be spaced a distance radially from the central conductor 1210 to form the common mode traps 1212, 1214, 1216. As depicted in FIG. 11, the radial distance may be tapered towards the end of the common mode traps to reduce or altogether eliminate fringe effects. In this way, the common mode traps 1212, 1214, 1216 may be continuously or contiguously positioned without substantial gaps therebetween.

Figure 12:
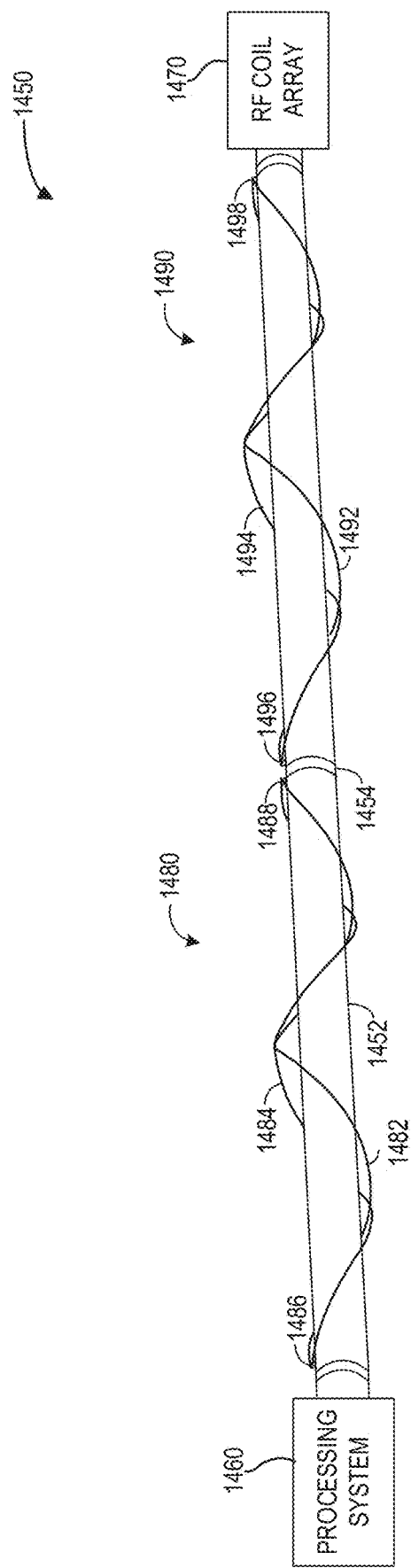

The tapered spiral configuration of the common mode trap conductors described herein above is particularly advantageous when multiple common mode trap conductors are contiguously disposed in a common mode trap assembly. As an illustrative example, FIG. 12 is a perspective view of an RF coil array interfacing cable 1450 including a plurality of continuous and/or contiguous common mode traps coupling an RF coil 1470 to a processing system 1460. RF coil array interfacing cable 1450 includes a first common mode trap 1480 and a second common mode trap 1490 positioned adjacent to each other on a central conductor 1452.

The first common mode trap 1480 includes a first common mode trap conductor 1482 and a second common mode trap conductor 1484 counterwound in a tapered spiral configuration. To that end, the first and second conductors 1482 and 1484 are fixed to posts 1486 and 1488. It should be noted that the posts 1486 and 1488 are aligned on a same side of the common mode trap 1480.

Similarly, the second common mode trap 1490 includes a third common mode trap conductor 1492 and a fourth common mode trap conductor 1494 counterwound in a tapered spiral configuration and fixed to posts 1496 and 1498. It should be noted that the posts 1496 and 1498 are aligned on a same side of the common mode trap 1490.

As depicted, the common mode traps 1480 and 1490 are separated by a distance, thereby exposing the central conductor 1452 in the gap 1454 between the common mode traps. Due to the tapering spiral configuration of the common mode trap conductors of the common mode traps, the gap 1454 can be minimized or altogether eliminated in order to increase the density of common mode traps in a common mode trap assembly without loss of impedance functions of the common mode traps. That is, the distance can be made arbitrarily small such that the common mode traps are in contact, given the tapered spiral configuration.

It should be appreciated that while the RF coil array interfacing cable 1450 includes two common mode traps 1480 and 1490, in practice an RF coil array interfacing cable may include more than two common mode traps.

Further, the common mode traps 1480 and 1490 of the RF coil array interfacing cable 1450 are aligned such that the posts 1486, 1488, 1496, and 1498 are aligned on a same side of the RF coil array interfacing cable. However, in examples where cross-talk between the common mode traps may be possible, for example if the tapering of the counterwound conductors is more severe or steep, the common mode traps may be rotated with respect to one another to further reduce fringe effects and/or cross-talk between the traps.

Additionally, other common mode trap or balun configurations are possible. For example, the exterior shielding of each common mode trap may be trimmed such that the common mode traps can be overlapped or interleaved, thus increasing the density of the common mode traps.

In some examples, the RF coils described above with reference to FIGS. 7-12 may have one of a plurality of different resonant frequencies, and/or one or more RF coils of the RF coil arrays described above may have different resonant frequencies relative to one or more other RF coils. In one example, a gauge of the loop portion of the RF coils, a spacing between wires of the RF coils, a diameter of the loop portion, and/or a number and/or arrangement of cuts in the wires of the RF coils may alter the resonant frequency of the RF coils. RF coils having an appropriate resonant frequency may be selected for various MRI systems (e.g., systems in which the static magnetic field has a specified magnitude, such as 1.5 Tesla, 3 Tesla, 7 Tesla, etc.) and/or may be selected according to an anatomical feature to be imaged by the MRI system (e.g., RF coils for imaging a posterior of the patient may have a different resonant frequency than RF coils for imaging an anterior of the patient).

FIGS. 2-6 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

By configuring the RF coil assembly to include the posterior end and anterior end each joined to the central section, the RF coil assembly may be more easily coupled to the body of the patient. The flexible posterior end, anterior end, and central section may individually bend, twist, or otherwise deform to enable the RF coil assembly to fit to anatomical features that are difficult to image with conventional, rigid RF coils, such as the groin, perineum, and region of the prostate and genitals. As a result, SNR and patient comfort may be increased. Further, by positioning the central section between the legs of the patient and configuring the coil-interfacing cable to extend outward from the central section away from the patient, the operator of the MRI system may more easily access the coil-interfacing cable in order to couple the coil-interfacing cable to the MRI system, and the patient may be positioned flat against a support surface or table of the MRI system without degradation of the coil-interfacing cable.

The technical effect of configuring the RF coil assembly to include the posterior end, anterior end, and central section joined to the posterior end and anterior end is to enable the RF coil assembly to image the prostate of the patient and the surrounding anatomy.

In one embodiment, a radio frequency (RF) coil assembly for a magnetic resonance imaging (MRI) system comprises: a posterior end including a first flexible RF coil; an anterior end removably coupleable with the posterior end and including a second flexible RF coil; a central section extending between the posterior end and anterior end and including a third flexible RF coil; and where each flexible RF coil includes a loop portion comprising a coupling electronics portion and at least two parallel, distributed capacitance wire conductors encapsulated and separated by a dielectric material. In a first example of the RF coil assembly, the first flexible RF coil is one of nine flexible RF coils of the posterior end. A second example of the RF coil assembly optionally includes the first example, and further includes wherein the nine flexible RF coils of the posterior end are arranged in three rows, with a first row of the three rows including four flexible RF coils, with a second row of the three rows including three flexible RF coils, and with a third row of the three rows including two flexible RF coils. A third example of the RF coil assembly optionally includes one or both of the first and second examples, and further includes wherein the second row overlaps each of the first row and the third row, with the first row positioned closer to a terminating edge of the posterior end than the second row, and with the third row positioned further from the first row than the second row. A fourth example of the RF coil assembly optionally includes one or more or each of the first through third examples, and further includes wherein a diameter of each flexible RF coil of the first row is greater than a diameter of each flexible RF coil of the second row and third row. A fifth example of the RF coil assembly optionally includes one or more or each of the first through fourth examples, and further includes wherein the second flexible RF coil is one of two flexible RF coils of the central section. A sixth example of the RF coil assembly optionally includes one or more or each of the first through fifth examples, and further includes wherein a diameter of each of the two flexible RF coils of the central section is less than a diameter of each other flexible RF coil of the RF coil assembly. A seventh example of the RF coil assembly optionally includes one or more or each of the first through sixth examples, and further includes wherein an eccentricity of each of the two flexible RF coils of the central section is different than an eccentricity of each other flexible RF coil of the RF coil assembly. An eighth example of the RF coil assembly optionally includes one or more or each of the first through seventh examples, and further includes wherein the second flexible RF coil overlaps one of the first flexible RF coil or third flexible RF coil, and wherein the two flexible RF coils of the central section overlap each other. A ninth example of the RF coil assembly optionally includes one or more or each of the first through eighth examples, and further includes wherein the third flexible RF coil is one of five flexible RF coils of the anterior section. A tenth example of the RF coil assembly optionally includes one or more or each of the first through ninth examples, and further includes wherein the five flexible RF coils of the anterior end are arranged in two rows, with a first row of the two rows including three flexible RF coils, and with a second row of the two rows including two flexible RF coils. An eleventh example of the RF coil assembly optionally includes one or more or each of the first through tenth examples, and further includes wherein the first row overlaps the second row, with the first row positioned closer to a terminating edge of the anterior end than the second row. A twelfth example of the RF coil assembly optionally includes one or more or each of the first through eleventh examples, and further includes wherein a diameter of each flexible RF coil of the first row is greater than a diameter of each flexible RF coil of the second row. A thirteenth example of the RF coil assembly optionally includes one or more or each of the first through twelfth examples, and further includes wherein the posterior end includes a first extension and a second extension, the anterior end includes a third extension and a fourth extension, and the anterior end is removably coupleable with the posterior end via engagement of fasteners of the first extension and third extension with respective counterpart fasteners of the second extension and fourth extension. A fourteenth example of the RF coil assembly optionally includes one or more or each of the first through thirteenth examples, and further includes a coil-interfacing cable extending outward from a port of the RF coil assembly. A fifteenth example of the RF coil assembly optionally includes one or more or each of the first through fourteenth examples, and further includes wherein the port is positioned at a center of the central section and is open at an outer side of the RF coil assembly, with the port and coil-interfacing cable positioned between legs of a subject to be imaged while the RF coil assembly is coupled to the subject. In another example, the port is offset from the center of the central section.

In another embodiment, a radio frequency (RF) coil assembly for a magnetic resonance imaging (MRI) system comprises: a posterior end including a first set of flexible RF coils; an anterior end removably coupleable with the posterior end and including a second set of flexible RF coils; a central section extending between the posterior end and anterior end and including a third set of flexible RF coils; and where each flexible RF coil of the first set, second set, and third set of flexible RF coils includes a loop portion comprising a coupling electronics portion and at least two parallel, distributed capacitance wire conductors encapsulated and separated by a dielectric material. In a first example of the RF coil assembly, the first set of flexible RF coils includes nine flexible RF coils. A second example of the RF coil assembly optionally includes the first example, and further includes wherein the nine flexible RF coils of the first set of flexible RF coils are arranged in three rows, with a first row of the three rows including four flexible RF coils, with a second row of the three rows including three flexible RF coils, and with a third row of the three rows including two flexible RF coils. A third example of the RF coil assembly optionally includes one or both of the first and second examples, and further includes wherein the second row overlaps each of the first row and the third row, with the first row positioned closer to a terminating edge of the posterior end than the second row, and with the third row positioned further from the first row than the second row. A fourth example of the RF coil assembly optionally includes one or more or each of the first through third examples, and further includes wherein a diameter of each flexible RF coil of the first row is greater than a diameter of each flexible RF coil of the second row and third row. A fifth example of the RF coil assembly optionally includes one or more or each of the first through fourth examples, and further includes wherein the third set of flexible RF coils includes two flexible RF coils. A sixth example of the RF coil assembly optionally includes one or more or each of the first through fifth examples, and further includes wherein a diameter of each of the two flexible RF coils of the third set of flexible RF coils is less than a diameter of each other flexible RF coil of the RF coil assembly. A seventh example of the RF coil assembly optionally includes one or more or each of the first through sixth examples, and further includes wherein an eccentricity of each of the two flexible RF coils of the third set of flexible RF coils is different than an eccentricity of each other flexible RF coil of the RF coil assembly. An eighth example of the RF coil assembly optionally includes one or more or each of the first through seventh examples, and further includes wherein the two flexible RF coils of the third set of flexible RF coils includes a first flexible RF coil overlapping a corresponding flexible RF coil of the first set or second set of flexible RF coils, and wherein the two flexible RF coils of the third set of flexible RF coils overlap each other. A ninth example of the RF coil assembly optionally includes one or more or each of the first through eighth examples, and further includes wherein the second set of flexible RF coils includes five flexible RF coils. A tenth example of the RF coil assembly optionally includes one or more or each of the first through ninth examples, and further includes wherein the five flexible RF coils of the anterior end are arranged in two rows, with a first row of the two rows including three flexible RF coils, and with a second row of the two rows including two flexible RF coils. An eleventh example of the RF coil assembly optionally includes one or more or each of the first through tenth examples, and further includes wherein the first row overlaps the second row, with the first row positioned closer to a terminating edge of the anterior end than the second row. A twelfth example of the RF coil assembly optionally includes one or more or each of the first through eleventh examples, and further includes wherein a diameter of each flexible RF coil of the first row is greater than a diameter of each flexible RF coil of the second row. A thirteenth example of the RF coil assembly optionally includes one or more or each of the first through twelfth examples, and further includes wherein the posterior end includes a first extension and a second extension, the anterior end includes a third extension and a fourth extension, and the anterior end is removably coupleable with the posterior end via engagement of fasteners of the first extension and third extension with respective counterpart fasteners of the second extension and fourth extension. A fourteenth example of the RF coil assembly optionally includes one or more or each of the first through thirteenth examples, and further includes a coil-interfacing cable extending outward from a port of the RF coil assembly. A fifteenth example of the RF coil assembly optionally includes one or more or each of the first through fourteenth examples, and further includes wherein the port is open at an outer side of the RF coil assembly.

In another embodiment, a radio frequency (RF) coil assembly for a magnetic resonance imaging (MRI) system comprises: a posterior end including a first RF coil set comprising a first plurality of RF coil elements; an anterior end including a second RF coil set comprising a second plurality of RF coil elements; and a central section extending between the posterior end and anterior end and including a third RF coil set comprising a third plurality of RF coil elements, the first plurality of RF coil elements including more RF coil elements than the second plurality of RF coil elements, and the second plurality of RF coil elements including more RF coil elements than the third plurality of RF coil elements, each RF coil element including a loop portion comprising a coupling electronics portion and at least two parallel, distributed capacitance wire conductors encapsulated and separated by a dielectric material. In a first example of the RF coil assembly, the first RF coil set includes exactly nine RF coil elements and no other RF coil elements, the second RF coil set includes exactly five RF coil elements and no other RF coil elements, the third RF coil set includes exactly two RF coil elements and no other RF coil elements, and none of the RF coil elements of the first RF coil set overlap the RF coil elements of the second RF coil set.

In another embodiment, a radio frequency (RF) coil assembly for a magnetic resonance imaging (MRI) system comprises: a posterior end including a first RF coil set comprising nine RF coil elements arranged into three rows; an anterior end including a second RF coil set comprising five RF coil elements arranged into two rows; a central section extending between the posterior end and anterior end and including two RF coil elements, each RF coil element including a loop portion comprising a coupling electronics portion and at least two parallel, distributed capacitance wire conductors encapsulated and separated by a dielectric material; and a coil interfacing cable extending outward from a port positioned at a center of the central section, the coil interfacing cable configured to couple each coupling electronics portion to a control unit of the MRI system. In a first example of the RF coil assembly, a first RF coil element of the two RF coil elements of the central section overlaps at least one RF coil element of the nine RF coil elements of the first RF coil set, a second RF coil element of the two RF coil elements of the central section overlaps at least one RF coil element of the five RF coil elements of the second RF coil set, and the port is encircled by each of the first RF coil element and second RF coil element. In another example, the port is offset from the center of the central section.

In another embodiment, a radio frequency (RF) coil assembly for a magnetic resonance imaging (MRI) system comprises: a posterior end including a first set of flexible RF coils; an anterior end including a second set of flexible RF coils; a central section extending between the posterior end and anterior end, wherein the posterior end and the anterior end are bendable to the central section; and where each flexible RF coil of the first set and second set of flexible RF coils includes a loop portion comprising a coupling electronics portion and at least two parallel, distributed capacitance wire conductors encapsulated and separated by a dielectric material. In a first example of the RF coil assembly, the first set of flexible RF coils includes nine flexible RF coils. A second example of the RF coil assembly optionally includes the first example, and further includes wherein the nine flexible RF coils of the first set of flexible RF coils are arranged in three rows, with a first row of the three rows including four flexible RF coils, with a second row of the three rows including three flexible RF coils, and with a third row of the three rows including two flexible RF coils. A third example of the RF coil assembly optionally includes one or both of the first and second examples, and further includes wherein the second row overlaps each of the first row and the third row, with the first row positioned closer to a terminating edge of the posterior end than the second row, and with the third row positioned further from the first row than the second row. A fourth example of the RF coil assembly optionally includes one or more or each of the first through third examples, and further includes wherein a diameter of each flexible RF coil of the first row is greater than a diameter of each flexible RF coil of the second row and third row. A fifth example of the RF coil assembly optionally includes one or more or each of the first through fourth examples, and further includes wherein the central section includes a third set of flexible RF coils, and the third set of flexible RF coils includes two flexible RF coils, each including a loop portion comprising a coupling electronics portion and at least two parallel, distributed capacitance wire conductors encapsulated and separated by a dielectric material. A sixth example of the RF coil assembly optionally includes one or more or each of the first through fifth examples, and further includes wherein a diameter of each of the two flexible RF coils of the third set of flexible RF coils is less than a diameter of each flexible RF coil of the first and second sets of RF coils. A seventh example of the RF coil assembly optionally includes one or more or each of the first through sixth examples, and further includes wherein an eccentricity of each of the two flexible RF coils of the third set of flexible RF coils is different than an eccentricity of each flexible RF coil of the first and second sets of RF coils. An eighth example of the RF coil assembly optionally includes one or more or each of the first through seventh examples, and further includes wherein the two flexible RF coils of the third set of flexible RF coils includes a first flexible RF coil overlapping a corresponding flexible RF coil of the first set or second set of flexible RF coils, and wherein the two flexible RF coils of the third set of flexible RF coils overlap each other. A ninth example of the RF coil assembly optionally includes one or more or each of the first through eighth examples, and further includes wherein the second set of flexible RF coils includes five flexible RF coils. A tenth example of the RF coil assembly optionally includes one or more or each of the first through ninth examples, and further includes wherein the five flexible RF coils of the anterior end are arranged in two rows, with a first row of the two rows including three flexible RF coils, and with a second row of the two rows including two flexible RF coils. An eleventh example of the RF coil assembly optionally includes one or more or each of the first through tenth examples, and further includes wherein the first row overlaps the second row, with the first row positioned closer to a terminating edge of the anterior end than the second row. A twelfth example of the RF coil assembly optionally includes one or more or each of the first through eleventh examples, and further includes wherein a diameter of each flexible RF coil of the first row is greater than a diameter of each flexible RF coil of the second row. A thirteenth example of the RF coil assembly optionally includes one or more or each of the first through twelfth examples, and further includes a coil-interfacing cable extending outward from a port of the RF coil assembly, wherein the cable is electrically connected to the first and second sets of RF coils. A fourteenth example of the RF coil assembly optionally includes one or more or each of the first through thirteenth examples, and further includes two coil-interfacing cables extending from two ports of the RF coil assembly, wherein one cable is electrically connected to the first set of RF coils, and the other cable is electrically connected to the second set of RF coils.

In another embodiment, a wearable radio frequency (RF) coil assembly for a magnetic resonance imaging (MRI) system comprises: a body configured to be worn by a subject being scanned, the body comprising: a posterior end including a first set of flexible RF coils, wherein the posterior end is configured to wrap around a posterior side of the subject; an anterior end including a second set of flexible RF coils, wherein the anterior end is configured to wrap around an anterior side of the subject; and a central section extending between the posterior end and anterior end, wherein each RF coil element of the first and second sets of flexible RF coils includes a loop portion comprising a coupling electronics portion and at least two parallel, distributed capacitance wire conductors encapsulated and separated by a dielectric material. In a first example of the wearable RF coil assembly, the first set of flexible RF coils consists of nine RF coil elements, the second set of flexible RF coils consists of five RF coil elements, and the central section includes a third set of flexible RF coils consisting of two RF coil elements. A second example of the wearable RF coil assembly optionally includes the first example, and further includes wherein the body is formed of a flexible material transparent to RF signals, and the first and second sets of flexible RF coils are embedded within the flexible material. A third example of the RF coil assembly optionally includes one or both of the first or second examples, and further includes wherein the flexible material includes one or more layers of meta-aramid material. A fourth example of the RF coil assembly optionally includes one or more or each of the first through third examples, and further includes wherein the body is configured to wrap around a hip of the subject.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) coil assembly for a magnetic resonance imaging (MRI) system, comprising:
   a posterior end including a first set of flexible RF coils;
   an anterior end including a second set of flexible RF coils;
   a central section which during operation extends a length between the posterior end and the anterior end, wherein the posterior end and the anterior end are bendable to the central section;
   where each flexible RF coil of the first set and second set of flexible RF coils includes a loop portion comprising a coupling electronics portion and at least two parallel, distributed capacitance wire conductors encapsulated and separated by a dielectric material, wherein each of the distributed capacitance wire conductors includes a first terminating end and a second terminating end;
   wherein the coupling electronics portion includes a pre-amplifier, a decoupling diode, and an impedance inverter circuit and wherein the decoupling diode is directly connected between at least two first terminating ends of the at least two distributed capacitance wire conductors;
   wherein the at least two distributed capacitance wire conductors are continuous along an entire length of the loop portion;
   wherein the impedance inverter circuit includes an impedance matching network and an input balun having two input terminals and two output terminals, wherein the pre-amplifier comprises a low input impedance pre-amplifier optimized for high source impedance, and wherein the impedance matching network provides the high source impedance;
   wherein the input balun is connected between the decoupling diode and the impedance matching network and wherein the second terminating end of one of the at least two distributed capacitance wire conductors is directly connected to one input end of the input balun; and
   wherein the central section does not include RF coils.

2. The RF coil assembly of claim 1, wherein the first set of flexible RF coils includes nine flexible RF coils.

3. The RF coil assembly of claim 2, wherein the nine flexible RF coils of the first set of flexible RF coils are arranged in three rows, with a first row of the three rows including four flexible RF coils, with a second row of the three rows including three flexible RF coils, and with a third row of the three rows including two flexible RF coils.

4. The RF coil assembly of claim 3, wherein the second row overlaps each of the first row and the third row, with the first row positioned closer to a terminating edge of the posterior end than the second row, and with the third row positioned further from the first row than the second row.

5. The RF coil assembly of claim 4, wherein a diameter of each flexible RF coil of the first row is greater than a diameter of each flexible RF coil of the second row and third row.

6. The RF coil assembly of claim 1, wherein the five flexible RF coils of the anterior end are arranged in two rows, with a first row of the two rows including three flexible RF coils, and with a second row of the two rows including two flexible RF coils.

7. The RF coil assembly of claim 6, wherein the first row overlaps the second row, with the first row positioned closer to a terminating edge of the anterior end than the second row.

8. The RF coil assembly of claim 7, wherein a diameter of each flexible RF coil of the first row is greater than a diameter of each flexible RF coil of the second row.

9. The RF coil assembly of claim 1, further comprising a coil-interfacing cable extending outward from a port of the RF coil assembly, wherein the cable is electrically connected to the first and second sets of RF coils.

10. The RF coil assembly of claim 9, wherein the coil-interfacing cable includes a central conductor and a plurality of common mode traps that are tuned independently.

11. The RF coil assembly of claim 1, further comprising two coil-interfacing cables extending from two ports of the RF coil assembly, wherein one cable is electrically connected to the first set of RF coils, and the other cable is electrically connected to the second set of RF coils.

12. The RF coil assembly of claim 1, wherein a distributed capacitance loop formed by the distributed capacitance wire conductors is void of discrete or lumped capacitive and inductive components.

13. The RF coil assembly of claim 1, wherein a length of the distributed capacitance wire conductors is varied to achieve a desired value of a distributed capacitance.

14. The RF coil assembly of claim 1, wherein the at least two distributed capacitance wire conductors include planar strips.

15. The RF coil assembly of claim 1, wherein the at least two distributed capacitance wire conductors are twisted upon one another.

16. The RF coil assembly of claim 1, the pre-amplifier has an impedance value which is less than 5 ohms at a resonance frequency.

17. The RF coil assembly of claim 1, wherein the low input impedance pre-amplifier is optimized for high source impedance of at least 500 ohms.

18. The RF coil assembly of claim 1, wherein the one of the two output terminals of the input balun is connected to a ground connection and the other output terminal is connected to the impedance matching network.

19. A wearable radio frequency (RF) coil assembly for a magnetic resonance imaging (MRI) system, comprising:
   a body configured to be worn by a subject being scanned, the body comprising:
      a posterior end including a first set of flexible RF coils, wherein the posterior end is configured to wrap around a posterior side of the subject;
      an anterior end including a second set of flexible RF coils, wherein the anterior end is configured to wrap around an anterior side of the subject;
      a central section which during operation extends a length between the posterior end and the anterior end,
      wherein each RF coil element of the first and second sets of flexible RF coils includes a loop portion comprising a coupling electronics portion and at least two parallel, distributed capacitance wire conductors encapsulated and separated by a dielectric material, wherein each of the at least two distributed capacitance wire conductors includes a first terminating end and a second terminating end;
   wherein the coupling electronics portion includes a pre-amplifier, a decoupling diode, and an impedance inverter circuit and wherein the decoupling diode is directly connected between at least two first terminating ends of the at least two distributed capacitance wire conductors;
   wherein the at least two distributed capacitance wire conductors are continuous along an entire length of the loop portion;
   wherein the impedance inverter circuit includes an impedance matching network and an input balun having two input terminals and two output terminals, wherein the pre-amplifier comprises a low input impedance pre-amplifier optimized for high source impedance, and wherein the impedance matching network provides the high source impedance;
   wherein the input balun is connected between the decoupling diode and the impedance matching network and wherein the second terminating end of one of the at least two distributed capacitance wire conductors is directly connected to one input end of the input balun; and
   wherein the central section does not include RF coils.

20. The wearable RF coil assembly of claim 19, wherein the body is formed of a flexible material transparent to RF signals, and the first and second sets of flexible RF coils are embedded within the flexible material.

21. The wearable RF coil assembly of claim 20, wherein the flexible material includes one or more layers of meta-aramid material.

* * * * *